US010685782B2

(12) United States Patent
Lazarev et al.

(10) Patent No.: US 10,685,782 B2
(45) Date of Patent: *Jun. 16, 2020

(54) CAPACITOR AND METHOD OF PRODUCTION THEREOF

(71) Applicant: CAPACITOR SCIENCES INCORPORATED, Menlo Park, CA (US)

(72) Inventors: Pavel Ivan Lazarev, Menlo Park, CA (US); Barry K. Sharp, San Francisco, CA (US); Paul Furuta, Sunnyvale, CA (US); Yan Li, Fremont, CA (US); Ian S. G. Kelly-Morgan, San Francisco, CA (US); Matthew R. Robinson, San Francisco, CA (US); Daniel Membreno, Fremony, CA (US)

(73) Assignee: CAPACITOR SCIENCES INCORPORATED, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/454,221

(22) Filed: Jun. 27, 2019

(65) Prior Publication Data

US 2019/0341188 A1 Nov. 7, 2019

Related U.S. Application Data

(63) Continuation of application No. 15/449,524, filed on Mar. 3, 2017, now Pat. No. 10,340,082, which is a
(Continued)

(51) Int. Cl.
*H01G 4/18* (2006.01)
*H01G 4/14* (2006.01)
(Continued)

(52) U.S. Cl.
CPC ......... *H01G 4/186* (2013.01); *C08G 73/0266* (2013.01); *H01G 4/002* (2013.01);
(Continued)

(58) Field of Classification Search
None
See application file for complete search history.

(56) References Cited

U.S. PATENT DOCUMENTS

| 3,407,394 A | 10/1968 | Hartke |
| 4,549,034 A | 10/1985 | Sato ........................ A61B 18/00 174/17 LF |

(Continued)

FOREIGN PATENT DOCUMENTS

| CA | 2074848 A1 | 2/1998 |
| CN | 1582506 A | 2/2005 |

(Continued)

OTHER PUBLICATIONS

International Search Report and Written Opinion dated Mar. 21, 2019 for International Patent Application No. PCT/US2016/061784.
(Continued)

*Primary Examiner* — Dion Ferguson
(74) *Attorney, Agent, or Firm* — BCF LLP

(57) ABSTRACT

A capacitor includes a first electrode, a second electrode, and a dielectric layer of molecular material disposed between said first and second electrodes. The molecular material is described by the general formula:

$$D_p\text{-(Core)-}H_q,$$

where Core is a polarizable conductive anisometric core, having conjugated π-systems, and characterized by a longitudinal axis, D and H are insulating substituents, and p and
(Continued)

q are numbers of the D and H substituents accordingly. And Core possesses at least one dopant group that enhances polarizability.

13 Claims, 9 Drawing Sheets

Related U.S. Application Data continuation-in-part of application No. 14/710,491, filed on May 12, 2015, now Pat. No. 9,589,727.

(60) Provisional application No. 61/991,871, filed on May 12, 2014.

(51) Int. Cl.
| | | |
|---|---|---|
| *H01G 4/01* | (2006.01) | |
| *H01G 4/008* | (2006.01) | |
| *H01G 4/002* | (2006.01) | |
| *H01G 4/38* | (2006.01) | |
| *H01G 4/32* | (2006.01) | |
| *H02J 7/00* | (2006.01) | |
| *C08G 73/02* | (2006.01) | |
| *H01G 4/40* | (2006.01) | |
| *H01L 29/00* | (2006.01) | |
| *H02J 7/34* | (2006.01) | |

(52) U.S. Cl.
CPC .............. *H01G 4/008* (2013.01); *H01G 4/01* (2013.01); *H01G 4/18* (2013.01); *H01G 4/32* (2013.01); *H01G 4/38* (2013.01); *H01G 4/40* (2013.01); *H01L 29/00* (2013.01); *H02J 7/0068* (2013.01); *H01G 4/14* (2013.01); *H02J 7/345* (2013.01)

(56) References Cited

U.S. PATENT DOCUMENTS

| | | |
|---|---|---|
| 4,694,377 A | 9/1987 | MacDougall et al. |
| 4,702,562 A | 10/1987 | Scheuble et al. |
| 4,780,531 A | 10/1988 | Kano et al. |
| 4,894,186 A | 1/1990 | Gordon |
| 5,141,837 A | 8/1992 | Nguyen et al. |
| 5,187,639 A | 2/1993 | Ogawa et al. |
| 5,248,774 A | 9/1993 | Dietz et al. |
| 5,312,896 A | 5/1994 | Bhardwaj et al. |
| 5,384,521 A | 1/1995 | Coe |
| 5,395,556 A | 3/1995 | Drost et al. |
| 5,466,807 A | 11/1995 | Dietz et al. |
| 5,514,799 A | 5/1996 | Varanasi et al. |
| 5,581,437 A | 12/1996 | Sebillotte et al. |
| 5,583,359 A | 12/1996 | Ng et al. |
| 5,597,661 A | 1/1997 | Takeuchi et al. |
| 5,679,763 A | 10/1997 | Jen et al. |
| 5,742,471 A | 4/1998 | Barbee et al. |
| 5,840,906 A | 11/1998 | Zoltewicz et al. |
| 5,880,951 A | 3/1999 | Inaba |
| 6,025,094 A | 2/2000 | Visco et al. |
| 6,282,081 B1 | 8/2001 | Takabayashi et al. |
| 6,294,593 B1 | 9/2001 | Jeng et al. |
| 6,341,056 B1 | 1/2002 | Allman et al. |
| 6,391,104 B1 | 5/2002 | Schulz |
| 6,426,861 B1 | 7/2002 | Munshi |
| 6,501,093 B1 | 12/2002 | Marks |
| 6,519,136 B1 | 2/2003 | Chu et al. |
| 6,617,830 B2 | 9/2003 | Nozu et al. |
| 6,798,642 B2 | 9/2004 | Decker et al. |
| 7,025,900 B2 | 4/2006 | Sidorenko et al. |
| 7,033,406 B2 | 4/2006 | Weir et al. |
| 7,211,824 B2 | 5/2007 | Lazarev |
| 7,342,755 B1 | 3/2008 | Horvat et al. |
| 7,460,352 B2 | 12/2008 | Jamison et al. |
| 7,466,536 B1 | 12/2008 | Weir et al. |
| 7,498,689 B2 | 3/2009 | Mitani et al. |
| 7,579,709 B2 | 8/2009 | Goetz et al. |
| 7,625,497 B2 | 12/2009 | Iverson et al. |
| 7,678,907 B2 | 3/2010 | Koenemann et al. |
| 7,750,505 B2 | 7/2010 | Ichikawa |
| 7,795,431 B2 | 9/2010 | Pschirer et al. |
| 7,808,771 B2 | 10/2010 | Nguyen et al. |
| 7,837,902 B2 | 11/2010 | Hsu et al. |
| 7,893,265 B2 | 2/2011 | Facchietti et al. |
| 7,910,736 B2 | 3/2011 | Koenemann et al. |
| 7,947,199 B2 | 5/2011 | Wessling |
| 7,990,679 B2 | 8/2011 | Ehrenberg et al. |
| 8,143,853 B2 | 3/2012 | Jestin et al. |
| 8,222,074 B2 | 7/2012 | Lazarev |
| 8,231,809 B2 | 7/2012 | Pschirer et al. |
| 8,236,998 B2 | 8/2012 | Nagata et al. |
| 8,344,142 B2 | 1/2013 | Marder et al. |
| 8,372,527 B2 | 2/2013 | Morishita et al. |
| 8,404,844 B2 | 3/2013 | Kastler et al. |
| 8,527,126 B2 | 9/2013 | Yamamoto et al. |
| 8,552,179 B2 | 10/2013 | Lazarev |
| 8,766,566 B2 | 7/2014 | Baba et al. |
| 8,818,601 B1 | 8/2014 | V et al. |
| 8,831,805 B2 | 9/2014 | Izumi et al. |
| 8,895,118 B2 | 11/2014 | Geivandov et al. |
| 8,929,054 B2 | 1/2015 | Felten et al. |
| 8,938,160 B2 | 1/2015 | Wang |
| 9,056,676 B1 | 6/2015 | Wang |
| 9,293,260 B2 | 3/2016 | Schmid et al. |
| 9,589,727 B2* | 3/2017 | Lazarev .................. H01L 29/00 |
| 9,899,150 B2 | 2/2018 | Lazarev |
| 9,916,931 B2 | 3/2018 | Lazarev |
| 9,978,517 B2 | 5/2018 | Lazarev .................. H01G 4/14 |
| 10,153,087 B2 | 12/2018 | Lazarev et al. |
| 10,340,082 B2* | 7/2019 | Lazarev .................. H01G 4/38 |
| 2002/0027220 A1 | 3/2002 | Wang et al. |
| 2002/0048140 A1 | 4/2002 | Gallay et al. |
| 2003/0026063 A1 | 2/2003 | Munshi |
| 2003/0102502 A1 | 6/2003 | Togashi |
| 2003/0103319 A1 | 6/2003 | Kumar et al. |
| 2003/0105365 A1 | 6/2003 | Smith et al. |
| 2003/0142461 A1 | 7/2003 | Decker et al. |
| 2003/0160595 A1 | 8/2003 | Provanzana et al. |
| 2003/0219647 A1 | 11/2003 | Wariishi |
| 2004/0173873 A1 | 9/2004 | Kumar et al. |
| 2004/0222413 A1 | 11/2004 | Hsu et al. |
| 2004/0223291 A1 | 11/2004 | Naito et al. |
| 2005/0118083 A1 | 6/2005 | Tabuchi |
| 2006/0120014 A1 | 6/2006 | Nakamura et al. |
| 2006/0120020 A1 | 6/2006 | Dowgiallo |
| 2007/0001258 A1 | 1/2007 | Aihara |
| 2007/0108940 A1 | 5/2007 | Sainomoto et al. |
| 2007/0159767 A1 | 7/2007 | Jamison et al. |
| 2007/0181973 A1 | 8/2007 | Hung et al. |
| 2008/0002329 A1 | 1/2008 | Pohm et al. |
| 2008/0008949 A1 | 1/2008 | Wu et al. |
| 2008/0150484 A1 | 6/2008 | Kimball et al. |
| 2008/0266750 A1 | 10/2008 | Wu et al. |
| 2008/0283283 A1 | 11/2008 | Abe et al. |
| 2009/0040685 A1 | 2/2009 | Hiemer et al. |
| 2009/0184355 A1 | 7/2009 | Brederlow et al. |
| 2010/0011656 A1 | 1/2010 | Gessner et al. |
| 2010/0038629 A1 | 2/2010 | Lazarev |
| 2010/0085521 A1 | 4/2010 | Kasianova |
| 2010/0172066 A1 | 7/2010 | Baer et al. |
| 2010/0178728 A1 | 7/2010 | Zheng et al. |
| 2010/0183919 A1 | 7/2010 | Holme et al. |
| 2010/0193777 A1 | 8/2010 | Takahashi et al. |
| 2010/0214719 A1 | 8/2010 | Kim et al. |
| 2010/0233491 A1 | 9/2010 | Nickel et al. |
| 2010/0255381 A1 | 10/2010 | Holme et al. |
| 2010/0269731 A1 | 10/2010 | Jespersen et al. |
| 2010/0309606 A1 | 12/2010 | Alters et al. |
| 2010/0309696 A1 | 12/2010 | Guillot et al. |
| 2010/0315043 A1 | 12/2010 | Chau |
| 2011/0006393 A1 | 1/2011 | Cui |
| 2011/0042649 A1 | 2/2011 | Duvall et al. |
| 2011/0079733 A1 | 4/2011 | Langhals et al. |

(56) References Cited

U.S. PATENT DOCUMENTS

| | | | |
|---|---|---|---|
| 2011/0079773 A1 | 4/2011 | Wasielewski et al. | |
| 2011/0110015 A1 | 5/2011 | Zhang et al. | |
| 2011/0149393 A1 | 6/2011 | Nokel et al. | |
| 2011/0228442 A1 | 9/2011 | Zhang et al. | |
| 2012/0008251 A1 | 1/2012 | Yu et al. | |
| 2012/0033342 A1 | 2/2012 | Ito et al. | |
| 2012/0053288 A1 | 3/2012 | Morishita et al. | |
| 2012/0056600 A1 | 3/2012 | Nevin | |
| 2012/0059307 A1 | 3/2012 | Harris et al. | |
| 2012/0113380 A1 | 5/2012 | Geivandov et al. | |
| 2012/0244330 A1 | 9/2012 | Sun et al. | |
| 2012/0268862 A1 | 10/2012 | Song et al. | |
| 2012/0274145 A1 | 11/2012 | Taddeo | |
| 2012/0302489 A1 | 11/2012 | Rodrigues et al. | |
| 2013/0056720 A1 | 3/2013 | Kim et al. | |
| 2013/0187475 A1 | 7/2013 | Vendik et al. | |
| 2013/0194716 A1 | 8/2013 | Holme et al. | |
| 2013/0215535 A1 | 8/2013 | Bellomo | |
| 2013/0224473 A1 | 8/2013 | Tassell et al. | |
| 2013/0314839 A1 | 11/2013 | Terashima et al. | |
| 2013/0342967 A1 | 12/2013 | Lai et al. | |
| 2014/0035100 A1 | 2/2014 | Cho | |
| 2014/0036410 A1 | 2/2014 | Okamatsu et al. | |
| 2014/0098458 A1 | 4/2014 | Almadhoun et al. | |
| 2014/0158340 A1 | 6/2014 | Dixler et al. | |
| 2014/0169104 A1 | 6/2014 | Kan et al. | |
| 2014/0165260 A1 | 7/2014 | Chen et al. | |
| 2014/0268490 A1 | 9/2014 | Tsai et al. | |
| 2014/0316387 A1 | 10/2014 | Harris et al. | |
| 2014/0347787 A1 | 11/2014 | Fathi et al. | |
| 2015/0008671 A1 | 1/2015 | Rentero et al. | |
| 2015/0008735 A1 | 1/2015 | Mizoguchi | |
| 2015/0010849 A1 | 1/2015 | Elabd et al. | |
| 2015/0158392 A1 | 6/2015 | Zhao | |
| 2015/0162131 A1 | 6/2015 | Felten et al. | |
| 2015/0249401 A1 | 9/2015 | Eriksen et al. | |
| 2015/0302990 A1 | 10/2015 | Ghosh et al. | |
| 2016/0001662 A1 | 1/2016 | Miller et al. | |
| 2016/0020026 A1 | 1/2016 | Lazarev | |
| 2016/0020027 A1 | 1/2016 | Lazarev | |
| 2016/0254092 A1* | 9/2016 | Lazarev | C09D 151/003 361/311 |
| 2016/0314901 A1 | 10/2016 | Lazarev | |
| 2016/0340368 A1 | 11/2016 | Lazarev | |
| 2016/0379757 A1 | 12/2016 | Robinson et al. | |
| 2017/0117097 A1 | 4/2017 | Furuta et al. | |
| 2017/0133167 A1* | 5/2017 | Keller | H01G 4/18 |
| 2017/0232853 A1 | 8/2017 | Lazarev et al. | |
| 2017/0233528 A1* | 8/2017 | Sharp | C07D 471/22 361/301.5 |
| 2017/0236641 A1 | 8/2017 | Furuta et al. | |
| 2017/0236642 A1 | 8/2017 | Furuta et al. | |
| 2017/0236648 A1 | 8/2017 | Lazarev | H01G 9/07 320/166 |
| 2017/0237271 A1 | 8/2017 | Kelly-Morgan et al. | |
| 2017/0237274 A1 | 8/2017 | Lazarev et al. | |
| 2017/0287637 A1 | 10/2017 | Lazarev et al. | |
| 2017/0287638 A1 | 10/2017 | Lazarev et al. | |
| 2017/0301467 A1 | 10/2017 | Lazarev et al. | |
| 2018/0033554 A1 | 2/2018 | Li et al. | |
| 2018/0061582 A1 | 3/2018 | Furuta et al. | |
| 2018/0114641 A1* | 4/2018 | Lazarev | H01G 4/30 |
| 2018/0122143 A1 | 5/2018 | Ellwood | |
| 2018/0126857 A1 | 5/2018 | Kelly-Morgan | |
| 2018/0137978 A1 | 5/2018 | Hein et al. | |
| 2018/0137984 A1 | 5/2018 | Furuta et al. | |
| 2018/0158616 A1 | 6/2018 | Lazarev | H01G 4/32 |

FOREIGN PATENT DOCUMENTS

| | | |
|---|---|---|
| CN | 100449661 A | 1/2009 |
| CN | 1748271 B | 6/2010 |
| CN | 102426918 A | 4/2012 |
| CN | 103261370 A | 8/2013 |
| CN | 203118781 U | 8/2013 |
| CN | 203377785 U | 1/2014 |
| CN | 103755703 A | 4/2014 |
| CN | 103986224 A | 8/2014 |
| CN | 103258656 B | 8/2015 |
| DE | 10203918 A1 | 8/2003 |
| DE | 102010012949 A1 | 9/2011 |
| DE | 102011101304 A1 | 11/2012 |
| DE | 102012016438 A1 | 2/2014 |
| EP | 493716 A1 | 7/1992 |
| EP | 585999 A1 | 3/1994 |
| EP | 0602654 A1 | 6/1994 |
| EP | 0729056 A1 | 8/1996 |
| EP | 0791849 A1 | 8/1997 |
| EP | 0865142 B1 | 5/2008 |
| EP | 2062944 A1 | 5/2009 |
| EP | 2108673 A1 | 10/2009 |
| EP | 2415543 A1 | 2/2012 |
| EP | 1486590 B1 | 12/2013 |
| EP | 2759480 A1 | 7/2014 |
| EP | 1990682 B1 | 1/2015 |
| GB | 547853 A | 9/1942 |
| GB | 923148 A | 4/1963 |
| GB | 2084585 B | 11/1983 |
| JP | S6386731 A | 4/1988 |
| JP | H03253014 A | 11/1991 |
| JP | 2786298 B2 | 8/1998 |
| JP | 2000100484 A | 4/2000 |
| JP | 2001093778 A | 4/2001 |
| JP | 2007287829 A | 11/2007 |
| JP | 2010106225 A | 5/2010 |
| JP | 2010160989 A | 7/2010 |
| JP | 2011029442 A | 2/2011 |
| JP | 2014139296 A | 7/2014 |
| RU | 2199450 C1 | 2/2003 |
| RU | 2512880 C2 | 4/2014 |
| WO | 1990009616 A1 | 8/1990 |
| WO | 0139305 A1 | 5/2001 |
| WO | 2002026774 A2 | 4/2002 |
| WO | 2007078916 A2 | 7/2007 |
| WO | 2008038047 A2 | 4/2008 |
| WO | 2009144205 A1 | 12/2009 |
| WO | 2009158553 A2 | 12/2009 |
| WO | 2009158553 A3 | 3/2010 |
| WO | 2011056903 A1 | 5/2011 |
| WO | 2011137137 A1 | 11/2011 |
| WO | 2012012672 A2 | 1/2012 |
| WO | 2012084536 A1 | 6/2012 |
| WO | 2012122312 A1 | 9/2012 |
| WO | 2012142460 A1 | 10/2012 |
| WO | 2012162500 A2 | 11/2012 |
| WO | 2013009772 A1 | 1/2013 |
| WO | 2013085467 A1 | 6/2013 |
| WO | 2014009686 A1 | 1/2014 |
| WO | 2015003725 A1 | 1/2015 |
| WO | 2015175522 A1 | 11/2015 |

OTHER PUBLICATIONS

Non-Final Office Action for U.S. Appl. No. 15/043,247, dated Feb. 19, 2019.

Non-Final Office Action for U.S. Appl. No. 151469,126, dated Apr. 17, 2019.

Non-Final Office Action for U.S. Appl. No. 15/675,594, dated Apr. 19, 2019.

Non-Final Office Action for U.S. Appl. No. 15/870,504, dated Feb. 27, 2019.

Non-Final Office Action for U.S. Appl. No. 15/944,517, dated Apr. 19, 2019.

Notice of Allowance for U.S. Appl. No. 15/043,315, dated Feb. 21, 2019.

Notice of Allowance for U.S. Appl. No. 15/368,171, dated Apr. 10, 2019.

Notice of Allowance for U.S. Appl. No. 151782,752, dated Feb. 25, 2019.

Notice of Allowance for U.S. Appl. No. 15/801,240, dated Feb. 11, 2019.

(56) References Cited

OTHER PUBLICATIONS

Yang Zhao et al, "Theoretical study of one-photon and two-photon absorption properties of p1erylenetetracarboxylic derivatives", The Journal of Chemical Physics 129, 014301 (2008).

Extended European Search Report dated Aug. 8, 2018 for European Patent Application No. 16756391.5.

Extended European Search Report dated Sep. 24, 2018 for European Patent Application No. 15856609.1.

Extended European Search Report dated Sep. 26, 2018 for European Patent Application No. 16797411.2.

Final Office Action for U.S. Appl. No. 15/043,247, dated Oct. 24, 2018.

Final Office Action for U.S. Appl. No. 15/043,315, dated Jun. 7, 2018.

Final Office Action for U.S. Appl. No. 15/449,587, dated Oct. 10, 2018.

Final Office Action for U.S. Appl. No. 15/710,587, dated Month Day, Year.

M. Jurow et al, "Porphyrins as molectular electronic components of functional devices", Coordination Chemistry Reviews, Elsevier Science, Amsterdam NL, vol. 254, No. 19-20, Oct. 1, 2010, pp. 2297-2310.

Non-Final Office Action for U.S. Appl. No. 15/043,247, dated Jun. 7, 2018.

Non-Final Office Action for U.S. Appl. No. 15/430,339, dated Jul. 11, 2018.

Non-Final Office Action for U.S. Appl. No. 15/430,307, dated Jul. 16, 2018.

Non-Final Office Action for U.S. Appl. No. 15/710,587, dated Jul. 3, 2018.

Non-Final Office Action for U.S. Appl. No. 15/782,752, dated Sep. 21, 2018.

Non-Final Office Action for U.S. Appl. No. 15/801,240, dated Oct. 19, 2018.

Non-Final/Final Office Action for U.S. Appl. No. 15/430,391, dated Jul. 20, 2018.

Notice of Allowance for U.S. Appl. No. 15/163,595, dated Jul. 30, 2018.

Office Action dated May 18, 2018 for Chinese Patent Application for Invention No. 201580025110.

Co-Pending U.S. Appl. No. 15/194,224, to Lazarev et al., filed Jun. 27, 2016.

Co-Pending U.S. Appl. No. 15/368,171, to Lazarev et al., filed Dec. 2, 2016.

Co-Pending U.S. Appl. No. 15/430,307, to Lazarev et al, filed Feb. 10, 2017.

Co-Pending U.S. Appl. No. 15/449,587, to Lazarev et al., filed Mar. 3, 2017.

Co-Pending U.S. Appl. No. 15/615,614, to Kelly-Morgan, filed Aug. 11, 2017.

Co-Pending U.S. Appl. No. 15/710,587, to Li et al, filed Sep. 20, 2017.

Co-Pending U.S. Appl. No. 15/469,126, to Lazarev et al, filed Mar. 24, 2017.

D C Tiwari, et al: "Temperature dependent studies of electric and dielectric properties of polythiophene based nano composite", Indian Journal of Pure & Applied Physicsvol. 50, Jan. 2012. pp. 49-56.

Extended European Search Report. 15792494.5, dated Dec. 11, 2017.

Extended European Search Report for Application No. 15792405.1, dated Nov. 10, 2017.

Non-Final Office Action dated Feb. 14, 2018 for U.S. Appl. No. 15/043,186.

Final Office Action for U.S. Appl. No. 15/043,249, dated Feb. 6, 2018.

Final Office Action for U.S. Appl. No. 15/194,224, dated Jan. 30, 2018.

International Search Report and Written Opinion dated Jul. 31, 2017 for International Patent Application PCT/US2017/024589.

International Search Report and Written Opinion dated Feb. 23, 2018 for International Patent Application No. PCT/US17/64252.

International Search Report and Written Opinion dated Jun. 7, 2017 for International Application No. PCT/US2017/24589, to Pavel Ivan Lazarev, filed Jun. 7, 2017.

Non-Final Office Action for U.S. Appl. No. 15/043,315, dated Dec. 26, 2017.

Non-Final Office Action for U.S. Appl. No. 15/090,509, dated Jun. 22, 2017.

Non-Final Office Action for U.S. Appl. No. 15/163,595, dated Jan. 17, 2018.

Non-Final Office Action for U.S. Appl. No. 15/449,587, dated May 21, 2018.

Non-Final Office Action for U.S. Appl. No. 15/805,016, dated Jun. 4, 2018.

Non-Final/Final Office Action for U.S. Appl. No. 15/043,247, dated Feb. 20, 2018.

Notice of Allowance for U.S. Appl. No. 14/719,072, dated Nov. 16, 2017.

Notice of Allowance for U.S. Appl. No. 14/752,600, dated Nov. 24, 2017.

Notice of Allowance for U.S. Appl. No. 14/919,337, dated Mar. 5, 2018.

Notice of Allowance for U.S. Appl. No. 15/090,509, dated Jan. 24, 2018.

Office Action dated Dec. 13, 2017 for Taiwan Patent Application No. 106104499.

Office Action dated Dec. 13, 2017 for Taiwan Patent Application No. 106104500.

Office Action dated Jan. 25, 2018 for Chinese patent application No. 20158005146.4.

Office Action dated Oct. 19, 2017 for Taiwan patent Application No. 106104501.

Search Report and Written Opinion dated Feb. 7, 2018 for Singapore Patent Application No. 11201609435W.

Center for Dielectric Studies, Janosik, et al., "Ultra-High Energy Density Capacitors Through Improved Glass Technology", pp. 1-5 Center for Dielectric Studies Penn State University, dated 2004.

Chao-Hsien Ho et al., "High dielectric constant polyaniline/poly(acrylic acid) composites prepared by in situ polymerization", Synthetic Metals, vol. 158, pp. 630-637 (2008).

Congressional Research Service, Paul W. Partomak, "Energy Storage for Power Grids and Electric Transportation: A Technology Assessment", pp. 87-94; Members and Committees of Congress; Mar. 27, 2012.

Department of Chemistry and Biochemistry, Hardy, et al. "Converting an Electrical Insulator into a Dielectric Capacitor: End-Capping Polystyrene with Oligoaniline"; pp. 799-807, Rensselaer Polytechnic Institute, Troy, New York 12180; Feb. 17, 2013.

Department of Chemistry, Ho et al., "High dielectric constant polyanilinelpoly(acrylic acid) composites prepared by in situ polymerization", pp. 630-637; National Taiwan University, Taipei, Taiwan, ROC, Apr. 15, 2008.

Final Office Action for U.S. Appl. No. 14/919,337, dated May 1, 2017.

Henna Ruuska et al., "A Density Functional Study on Dielectric Properties of Acrylic Acid Crafted Polypropylene", The Journal of Chemical Physics, vol. 134, p. 134904 (2011).

Hindawi Publishing Corporation, Chávez-Castillo et al, "Third-Order Nonlinear Optical Behavor of Novel Polythiophene Derivatives Functionalized with Disperse Red 19 Chromophore", pp. 1-11, International Journal of Polymer Science vol. 2015, Article ID 219361, Mar. 12, 2015.

Hindawi Publishing Corporation, González-Espasandin et al., "Fuel Cells: A Real Option for Unmanned Aerial Vehicles Propulsion", pp. 1-13, Torrej'on de Ardoz, 28850 Madrid, Spain Jan. 30, 2014.

Hindawi Publishing Corporation, Khalil Ahmed et al., "High dielectric constant polyaniline/poly(acrylic acid) composites prepared by in situ polymerization", pp. 630-637, University of the Punjab, New Campus, Lahore 54590, Oct. 17, 7015.

Institute of Transportation Studies, Burke, et al. "Review of the Present and Future Applications of Supercapacitors in Electric and Hybrid Vehicles", pp. 2-23 UC Davis ITS; Dec. 2014.

(56) References Cited

OTHER PUBLICATIONS

International Search Report and Written Opinion for International Application No. PCT/US2015/030356, dated Jul. 28, 2015.
International Search Report and Written Opinion for International Application No. PCT/US2015/030415, dated Nov. 4, 2015.
International Search Report and Written Opinion for International Application No. PCT/US2015/058890, dated Feb. 25, 2016.
International Search Report and Written Opinion for International Application No. PCT/US2016/019641, dated Jul. 12, 2016.
International Search Report and Written Opinion for International Application No. PCT/US2016/033628, dated Sep. 1, 2016.
International Search Report and Written Opinion for International Application No. PCT/US2016/039395, dated Oct. 20, 2016.
International Search Report and Written Opinion for International Application No. PCT/US2016/039395, dated Jul. 1, 2016.
International Search Report and Written Opinion for International Application No. PCT/US2017/017146, dated May 11, 2017.
International Union of Pure and Applied Chemistry Polymer Divison Stejskal et al., "Polyaniline: Thin Films and Colloidal Dispersions (IUPAC Technical Report)", vol. 77, No. 5, pp. 815-826, Russian Academy of Sciences, St. Petersburg 199004, Russia; 2005.
JACS Articles, Kang et. al., "Ultralarge Hyperpolarizability Twisted π-Electron System Electro-Optic Chromophores: Synthesis, Solid-State and Solution-Phase Structural Characteristics, Electronic Structures, Linear and Nonlinear Optical Properties, and Computational Studies", pp. 3267-3286, Perugia, Italy Feb. 20, 2007.
Jaroslav Stejskal and Irina Sapurina, "Polyaniline: Thin Films and Colloidal Dispersions (IUPAC Technical Report)", Pure and Applied Chemistry, vol. 77, No. 5, pp. 815-826 (2005).
Kontrakt Technology Limited, Alla Sakharova, PhD., "Cryscade Solar Limited: Intellectual Property Portfolio summary", pp. 1-3, Cryscade Solar Limited; Apr. 9, 2015.
Microelectronics Research and Communications Institute, Founders et al., "High-Voltage Switching Circuit for Nanometer Scale CMOS Technologies", pp. 1-4, University of Idaho, Moscow, ID 83843 USA, Apr. 30, 2007.
Molecular Diversity Preservation International, Bather, et al. "Polymer Composite and Nanocomposite Dielectric Materials for Pulse Power Energy Storage" pp. 1-32; 29 University of South Carolina, Columbia, SC 29208 Oct. 2009.
Non-Final Office Action for U.S. Appl. No. 15/053,943, dated Apr. 19, 2017.
Non-Final Office Action for U.S. Appl. No. 14/752,600, dated Jan. 23, 2017.
Non-Final Office Action for U.S. Appl. No. 14/919,337, dated Jan. 4, 2017.
Notice of Allowance for U.S. Appl. No. 14/710,491, dated Oct. 24, 2016.
Optical Society of America, Kuzyk et al, "Theory of Molecular Nonlinear Optics", pp. 5, 4-82, Department of Physics and Astronomy, Washington State Unniersty, Pullman, Washington 99164-2814, USA, Mar. 26, 2013.
Philosophical Transactions of the Royal Society, SIMON, "Charge storage mechanism in nanoporous carbons and its consequence for electrical double layer capacitors" pp. 3457-3467; Drexel University, Philadelphia, PA 19104, 2010.
R. J. Baker and B. P. Johnson, "stacking power MOSFETs for use in high speed instrumentation", Department of Electrical Engineering, University of Nevada, Reno, Reno. Nevada 89557-0030; pp. 5799-5801 Aug. 3, 1992.
Roger D. Hartman and Herbert A. Pohl, "Hyper-electronic Polarization in Macromolecular Solids", Journal of Polymer Science: Part A-1, vol. 6, pp. 1135-1152 (1968).
RSC Publishing, Akl et al., "Molecular materials for switchable nonlinear optics in the solid slate, based on ruthenium-nitrosyl complexes", pp. 3518-3527, Porto Alegre, Brazil; May 24, 2013.
U.S. Appl. No. 15/043,186, to Paul T. Furuta, et al., filed Feb. 12, 2016.
U.S. Appl. No. 15/043,209, to Paul T. Furuta, et al., filed Feb. 12, 2016.
U.S. Appl. No. 15/043,247, to Barry K Sharp, et al., filed Feb. 12, 2016.
U.S. Appl. No. 15/043,315, to Ivan S.G. Kelley-Morgan, filed Feb. 12, 2016.
U.S. Appl. No. 15/090,509, to Pavel Ivan Lazarev, el al., filed Mar. 4, 2016.
U.S. Appl. No. 62/121,328, to Pavel Ivan Lazarev et al., filed Feb. 26, 2015.
U.S. Appl. No. 62/294,949, to Pavel Ivan Lazarev, et al., filed Feb. 12, 2016.
U.S. Appl. No. 62/294,955, to Pavel Ivan Lazarev, et al., filed Feb. 12, 2016.
U.S. Appl. No. 62/294,964, to Pavel Ivan Lazarev, et al., filed Feb. 12, 2016.
U.S. Appl. No. 62/318,134, to Pavel Ivan Lazarev, et al., filed Mar. 4, 2016.
Final Office Action for U.S. Appl. No. 15/043,247, dated Oct. 4, 2017.
Handy, Scott T. "Ionic Liquids-Classes and Properties" Published Sep. 2011, Accessed Aug. 28, 2017, InTechweb.org.
Hsing-Yang Tsai et al, "1,6- and 1,7-Regioisomers of Asymmetric and Symmetric Perylene Bisimides: Synthesis, Characterization and Optical Properties" Molecules, 2014, vol. 19, pp. 327-341.
Hsing-Yang Tsai et al, "Synthesis and optical properties of novel asymmetric perylene bisimides", Journal of Luminescence, vol. 149. pp. 103-111 (2014).
International Search Report and Written Opinion for International Application No. PCT/US2017/016862, dated Aug. 14, 2017.
International Search Report and Written Opinion for International Application No. PCT/US2017/24371, dated Aug. 2, 2017.
International Search Report and Written Opinion for International Application No. PCT/US2017/24600, Aug. 14, 2017.
Isoda, Kyosuke et al. "Truxene-Based Columnar Liquid Crystals: Self-Assembled Structures and Electro-Active Properties." Chemistry—An Asian Journal (2009), vol. 4, No. 10, pp. 1619-1625.
Johnson, Kieth E. "What's an Ionic Liquid?" The Electrochemical Society Interface, Published Spring 2007, pp. 38-41, Accessed Aug. 28, 2017.
Li, Li-Li et al. "Synthesis and Mesomorphism of Ether-ester Mixed Tail C3-symmetrical Truxene discotic liquid crystals." Liquid Crystals(2010), vol. 37, No. 5, pp. 499-506.
Liang, Mao et al. "Synthesis and Photovoltaic Performance of Two Triarylamine Organic Dyes Based on Truxene." Yinyong Huaxue (2011) vol. 28 No. 12, pp. 1387-1392.
Lu, Meng et al. "Organic Dyes Incorporating Bis-hexapropyltruxeneamino Moiely for efficient Dye-sensitized Solar Cells." Journal of Physical Chemistry C (2011) vol. 115, No. 1, pp. 274-281.
Maddalena, Francesco "Why are Ionic Liquids, Liquids?" http://www.quora.com/why-are-ionic-liquids-liquids?, Published Jan. 26, 2017, Accessed Aug. 28, 2017.
Nagabrahmandachari et al. "Synthesis and Spectral Analysis of Tin Tetracarboxylates and Phosphinates" Indian Journal of Chemistry—Section A, 1995, vol. 34A, pp. 658-660.
Ni, Hai-Lang et al. "Truxene Discotic Liquid Crystals with Two Different Ring Substituents: Synthesis, Metamorphosis and High Charged Carrier Mobility ." Liquid Crystals, vol. 40, No. 3, pp. 411-420.
Non-Final Office Action for U.S. Appl. No. 14/719,072, dated Aug. 2, 2017.
Non-Final Office Action for U.S. Appl. No. 15/043,247, dated Jun. 22, 2017.
Non-Final Office Action for U.S. Appl. No. 15/194,224, dated Sep. 27, 2017.
Notice of Allowance for U.S. Appl. No. 14/710,480, dated Oct. 6, 2017.
Notice of Allowance for U.S. Appl. No. 14/752,600, dated Jul. 27, 2017.
Notice of Allowance for U.S. Appl. No. 14/919,337, dated Jul. 19, 2017.
Notice of Allowance for U.S. Appl. No. 14/919,337, dated Nov. 8, 2017.

(56) References Cited

OTHER PUBLICATIONS

Notice of Allowance for U.S. Appl. No. 14/931,757, dated Jul. 17, 2017.
Notice of Allowance for U.S. Appl. No. 14/931,757, dated Oct. 31, 2017.
Notice of Allowance for U.S. Appl. No. 15/053,943, dated Aug. 14, 2017.
Taiwan Office Action for TW Application No. 106104501, dated Oct. 19, 2017.
Trevethan, Thomas et al. "Organic Molecules Reconstruct Nanostructures on Ionic Surfaces." Small (2011), vol. 7, No. 9, pp. 1264-1270.
Warmerdam, T. W. et al. "Discotic Liquid Crystals. Physical Parameters of some 2, 3, 7, 8, 12, 13-hexa(alkanoyloxy) truxenes: Observation of a Reentrant Isotropic Phase in a Pure Disk-like mesogen." Liquid Crystals (1988), vol. 3, No. 8, pp. 1087-1104.
Yue Wang, et al., "Morphological and Dimensional Control via Hierarchical Assembly of Doped Oligoaniline Single Crystals", J. Am. Chem. Soc. 2012, 134, pp. 9251-9262.
International Search Report and Written Opinion for International Application No. PCT/US2017/017150, dated May 18, 2017.
Non-Final Office Action for U.S. Appl. No. 14/710,480, dated May 8, 2017.
Non-Final Office Action for U.S. Appl. No. 15/043,186, dated Jun. 2 2017.
Non-Final Office Action dated Jun. 13, 2017 for U.S. Appl. No. 15/163,595.
Deruiter, J. Resonance and Induction Tutorial. Auburn University—Principles of Drug Action 1 Course Material. Spring 2005, 19 pages.
Manukian, BK. 216. IR.-spektroskopische Untersuchungen in der Imidazol-Reihe. Helvetica Chimica Acta. 1965, vol. 48, p. 2001.
International Search Report and Written Opinion for International Application No. PCT/US2016/57765, dated Jan. 5, 2017.
Non-Final/Final Office Action for U.S. Appl. No. 15/043,247, dated Jun. 22, 2017.
Deily, Dielectric and Oplical Characterization of Polar Polymeric Materials: Chromophore Entrained PMMA Thin Films, Thesis, 2008.
International Search Report and Written Opinion for international Application No. PCT/US2017/24150, dated Jun. 21, 2017.

\* cited by examiner

CAPACITOR AND METHOD OF PRODUCTION THEREOF

CLAIM OF PRIORITY

The present application is a continuation application of U.S. patent application Ser. No. 15/449,524, filed Mar. 3, 2017 which is a continuation-in-part of U.S. patent application Ser. No. 14/710,491, filed May 12, 2015, the entire contents of which are incorporated herein by reference. U.S. patent application Ser. No. 14/710,491 claims the priority benefit of U.S. Provisional Patent Application No. 61/991,871 filed May 12, 2014, the entire contents of which are incorporated herein by reference.

FIELD OF THE INVENTION

The present invention relates generally to passive components of electrical circuit and more particularly to a capacitor intended for energy storage and method of production thereof.

BACKGROUND OF THE INVENTION

A capacitor is a passive electronic component that is used to store energy in the form of an electrostatic field, and comprises a pair of electrodes separated by a dielectric layer. When a potential difference exists between two electrodes, an electric field is present in the dielectric layer. This field stores energy, and an ideal capacitor is characterized by a single constant value of capacitance which is a ratio of the electric charge on each electrode to the potential difference between them. In practice, the dielectric layer between electrodes passes a small amount of leakage current. Electrodes and leads introduce an equivalent series resistance, and dielectric layer has limitation to an electric field strength which results in a breakdown voltage. The simplest energy storage device consists of two parallel electrodes separated by a dielectric layer of permittivity ε, each of the electrodes has an area S and is placed on a distance d from each other. Electrodes are considered to extend uniformly over an area S, and a surface charge density can be expressed by the equation: $\pm \rho = \pm Q/S$. As the width of the electrodes is much greater than the separation (distance) d, an electrical field near the center of the capacitor will be uniform with the magnitude $E=\rho/\varepsilon$. Voltage is defined as a line integral of the electric field between electrodes. An ideal capacitor is characterized by a constant capacitance C defined by the formula:

$$C=Q/V, \quad (1)$$

which shows that capacitance increases with area and decreases with distance. Therefore the capacitance is largest in devices made of materials of high permittivity.

A characteristic electric field known as the breakdown strength $E_{bd}$, is an electric field in which the dielectric layer in a capacitor becomes conductive. Voltage at which this occurs is called the breakdown voltage of the device, and is given by the product of dielectric strength and separation between the electrodes:

$$V_{bd}=E_{bd}d \quad (2)$$

The maximal volumetric energy density stored in the capacitor is limited by the value proportional to $\sim \varepsilon \cdot E^2_{bd}$, where ε is dielectric permittivity and $E_{bd}$ is breakdown strength. Thus, in order to increase the stored energy of the capacitor it is necessary to increase dielectric permeability ε and breakdown strength $E_{bd}$ of the dielectric.

For high voltage applications much larger capacitors have to be used. There are a number of factors that can dramatically reduce the breakdown voltage. Geometry of the conductive electrodes is important for these applications. In particular, sharp edges or points hugely increase the electric field strength locally and can lead to a local breakdown. Once a local breakdown starts at any point, the breakdown will quickly "trace" through the dielectric layer till it reaches the opposite electrode and causes a short circuit.

Breakdown of the dielectric layer usually occurs as follows. The intensity of the electric field becomes high enough to free electrons from atoms of the dielectric material and the dielectric material begins to conduct an electric current from one electrode to another. Presence of impurities in the dielectric or imperfections of the crystal structure can result in an avalanche breakdown as observed in semiconductor devices, such as avalanche diodes and avalanche transistors.

Another important characteristic of a dielectric material is its dielectric permittivity. Different types of dielectric materials are used for capacitors and include ceramics, polymer film, paper, and electrolytic capacitors of different kinds. The most widely used polymer film materials are polypropylene and polyester. An important aspect of dielectric permittivity is that an increase of dielectric permittivity increases the maximum volumetric energy density that can be stored in a capacitor.

A material with an ultra-high dielectric constant was found to be the composite polyaniline, PANI-DBSA/PAA. PANI-DBSA/PAA is synthesized using in situ polymerization of aniline in an aqueous dispersion of poly-acrylic acid (PAA) in the presence of dodecylbenzene sulfonate (DBSA) (Chao-Hsien Hoa et al., "High dielectric constant polyaniline/poly(acrylic acid) composites prepared by in situ polymerization", Synthetic Metals 158 (2008), pp. 630-637). The water-soluble PAA serves as a polymeric stabilizer, protecting the PANI particles from macroscopic aggregation. A very high dielectric constant of ca. $2.0*10^5$ (at 1 kHz) is obtained for the composite containing 30% PANI by weight. SEM micrograph reveals that composites with high PANI content (i.e., 20 wt. %) consisted of numerous nanoscale PANI particles that are evenly distributed within the PAA matrix. The individual nano-scale PANI particles may be thought of as small capacitors. (Hoa et al.) attribute high dielectric constants to the sum of the small capacitors corresponding to the PANI particles. A major drawback of this material is a possible occurrence of percolation and formation of at least one continuous conductive path under electric field with probability of such an event increasing with an increase of the electric field. When at least one continuous path (track) through the neighboring conducting PANI particles is formed between electrodes of the capacitor, it decreases a breakdown voltage of the capacitor.

Single crystals of doped aniline oligomers are produced via a simple solution-based self-assembly method (see, Yue Wang, et. al., "Morphological and Dimensional Control via Hierarchical Assembly of Doped Oligoaniline Single Crystals", J. Am. Chem. Soc. 2012, 134, pp. 9251-9262). Detailed mechanistic studies have revealed that crystals of different morphologies and dimensions can be produced by a "bottom-up" hierarchical assembly where structures such as one-dimensional (1-D) nanofibers can be aggregated into higher order architectures. A large variety of crystalline nanostructures, including 1-D nanofibers and nanowires, 2-D nanoribbons and nanosheets, 3-D nanoplates, stacked sheets, nanoflowers, porous networks, hollow spheres, and twisted coils, can be obtained by controlling the nucleation of the crystals and the non-covalent interactions between the doped oligomers. These nanoscale crystals exhibit enhanced conductivity compared to their bulk counterparts as well as interesting structure-property relationships such as shape-dependent crystallinity. Furthermore, the morphology and dimension of these structures can be largely rationalized and predicted by monitoring molecule-solvent interactions via absorption studies.

There is a known energy storage device based on a multilayer structure. The energy storage device includes first and second electrodes, and a multilayer structure comprising blocking and dielectric layers. The first blocking layer is disposed between the first electrode and a dielectric layer, and the second blocking layer is disposed between the second electrode and a dielectric layer. Dielectric constants of the first and second blocking layers are both independently greater than the dielectric constant of the dielectric layer. FIG. 1 shows one exemplary design that includes electrodes 1 and 2, and multilayer structure comprising layers made of dielectric material (3, 4, 5) which are separated by layers of blocking material (6, 7, 8, 9). The blocking layers 6 and 9 are disposed in the neighborhood of the electrodes 1 and 2 accordingly and characterized by higher dielectric constant than dielectric constant of the dielectric material. A drawback of this device is that blocking layers of high dielectric permittivity located directly in contact with electrodes can lead to destruction of the energy storage device. Materials with high dielectric permittivity which are based on composite materials and contain polarized particles (such as PANI particles) might demonstrate a percolation phenomenon. The formed polycrystalline structure of layers has multiple tangling chemical bonds on borders between crystallites. When a material with a high dielectric permittivity possesses a polycrystalline structure is used a percolation might occur along the borders of crystal grains. Another drawback of current devices is that they require the expensive manufacturing procedure of vacuum deposition of all layers.

Capacitors as energy storage devices have well-known advantages versus electrochemical energy storage, e.g. a battery. Compared to batteries, capacitors can store energy with very high power density, i.e. charge/recharge rates, have long shelf life with little degradation, and can be charged and discharged (cycled) hundreds of thousands or millions of times. However, capacitors often do not store energy in a small volume or weight as in a case of batteries, or at low energy storage cost, which makes capacitors impractical for some applications, for example electric vehicles. Accordingly, it would be an advance in energy storage technology to provide capacitors of higher volumetric and mass energy storage density and lower cost.

The present invention solves a problem of the further increase of volumetric and mass density of reserved energy of the capacitor, and at the same time reduces cost of materials and manufacturing process.

SUMMARY OF THE INVENTION

Embodiments of the present invention provides a capacitor comprising a first electrode, a second electrode, and a dielectric layer of molecular material disposed between said first and second electrodes. Said electrodes are flat and planar and positioned parallel to each other. The molecular material is described by the general formula:

where Core is a polarizable conductive anisometric core, having conjugated π-systems, and characterized by a longitudinal axis, D and H are insulating substituents, and p and q are numbers of the D and H substituents accordingly. The insulating substituents are selectively attached to any available positions on the polarizable anisometric core including on apex positions and lateral positions as related the longitudinal axis of the Core, and p and q are independently selected from values 1, 2, 3, 4, and 5. And Core possesses one or more dopant groups that enhance polarizability.

A method of producing a capacitor, which comprises the steps of a) preparation of a conducting substrate serving as one of the electrodes, b) application of a molecular material on the substrate, c) formation of the solid layer molecular material layer on the substrate, and d) formation of the second electrode on the solid molecular material layer, wherein the molecular material is described by the general formula:

where Core is a conductive and polarizable anisometric core, having conjugated π-systems, and characterized by a longitudinal axis, D and H are insulating substituents, and p and q are numbers of the D and H substituents accordingly. The insulating substituents are selectively attached to any available positions on the polarizable anisometric core including apex positions and lateral positions as related the longitudinal axis of the Core, and p and q are independently selected from values 1, 2, 3, 4, and 5. And Core possesses one or more dopant groups that enhance polarizability.

DETAILED DESCRIPTION OF THE INVENTION

The general description of the present invention having been made, a further understanding can be obtained by reference to the specific preferred embodiments, which are given herein only for the purpose of illustration and are not intended to limit the scope of the appended claims.

Figure 1:
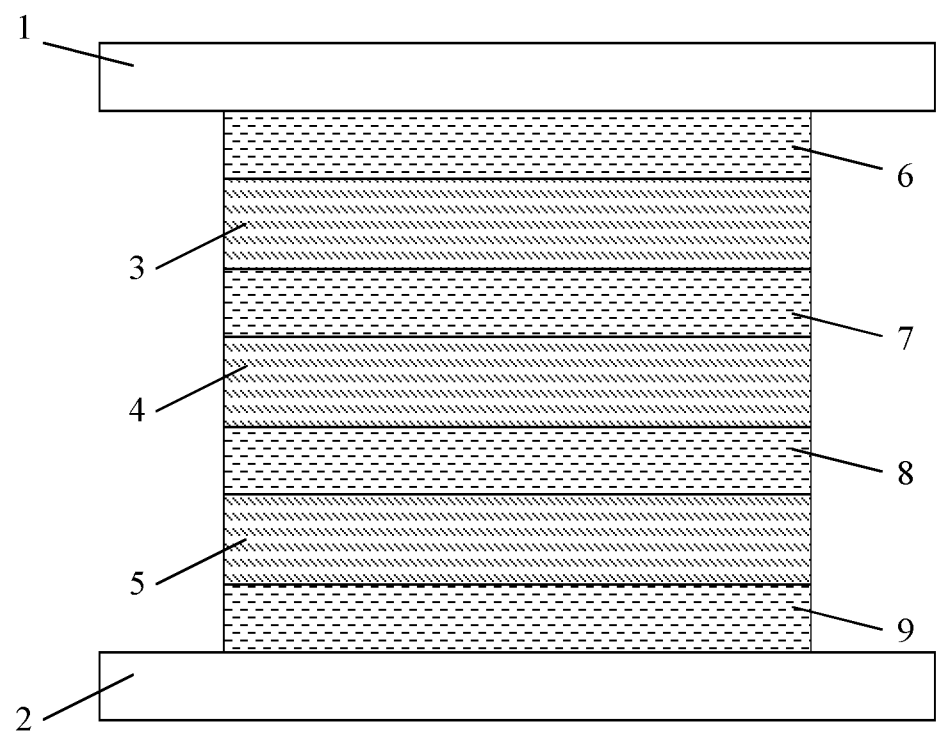
FIG. 1 is a schematic illustration that shows a typical design of an energy storage device according to the Prior Art.
Figure 2:
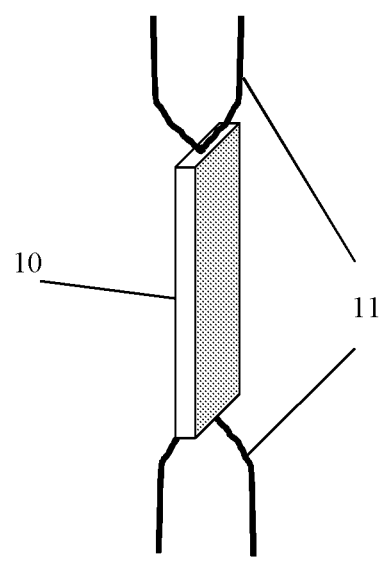
FIG. 2 is a schematic illustration that shows a single molecule of a molecular material, according to an embodiment of the invention.

The present invention provides a capacitor as disclosed hereinabove. The disclosed capacitor comprises a first electrode, a second electrode, and a dielectric layer of molecular material disposed between said first and second electrodes. Said electrodes are flat and planar and positioned parallel to each other. A molecule of the molecular material (schematically shown in FIG. 2) described by general formula:

$$D_p\text{-(Core)-}H_q, \quad (I)$$

where Core 10 is a polarizable conductive anisometric core, having conjugated π-systems, and characterized by a longitudinal axis, and insulating substituents D and H 11, and p and q are numbers of substituents D and H accordingly. The insulating substituents are selectively attached to the polarizable anisometric core including on apex positions and lateral positions as related the longitudinal axis of the Core, and p and q are independently selected from values 1, 2, 3, 4, and 5. And Core possesses one or more dopant groups that enhance polarizability.

The conductive anisometric core may be made further polarizable by adding a variety of dopant groups to various positions of the structure. Incorporating electron donors and electron acceptors is one way to enhance the polarizability. The electrophilic groups (acceptors) are selected from —$NO_2$, —$NH_3^+$ and —$NR_3^+$ (quaternary nitrogen salts), counterion $Cl^-$ or $Br^-$, —CHO (aldehyde), —CRO (keto group), —$SO_3H$ (sulfonic acids), —$SO_3R$ (sulfonates), $SO_2NH_2$ (sulfonamides), —COOH (carboxylic acid), —COOR (esters, from carboxylic acid side), —COCl (carboxylic acid chlorides), —$CONH_2$ (amides, from carboxylic acid side), —$CF_3$, —$CCl_3$, —CN, wherein R is radical selected from the list comprising alkyl (methyl, ethyl, isopropyl, tert-butyl, neopentyl, cyclohexyl etc.), allyl (—$CH_2$—CH=$CH_2$), benzyl (—$CH_2C_6H_5$) groups, phenyl (+substituted phenyl) and other aryl (aromatic) groups. The nucleophilic groups (donors) are selected from —$O^-$ (phenoxides, like —ONa or —OK), —$NH_2$, —NHR, —$NR_2$, —OH, —OR (ethers), —NHCOR (amides, from amine side), —OCOR (esters, from alcohol side), alkyls, —$C_6H_5$, vinyls, wherein R is radical selected from the list comprising alkyl (methyl, ethyl, isopropyl, tert-butyl, neopentyl, cyclohexyl etc.), allyl (—CH2-CH=CH2), benzyl (—CH2C6H5) groups, phenyl (+substituted phenyl) and other aryl (aromatic) groups. The existence of electrophilic groups (acceptors) and nucleophilic groups (donors) in the aromatic polycyclic conjugated molecule promotes the electronic polarizability of these molecules. Under the influence of an external electric field, electrons are displaced from the nucleophilic groups (donors) to the electrophilic groups (acceptors) this leads to increases in the electronic polarizability of such molecules. Thus the distribution of electronic density in these molecules is non-uniform. The presence of electro-conductive oligomers leads to a further increase of the polarization ability of the disclosed electro-polarizable compound because of electronic super conductivity of the electro-conductive oligomers. Ionic groups increase an ionic component of polarization of the disclosed electro-polarizable compound. Non-limiting examples of modified cores include rylene and fused rylene fragments where dopants may be placed on any ring in the system. The insulating tails may be attached to the ring structure or may be attached to the dopant groups. Herein we define the term "rylene fragment" to include any polyaromatic system with the rylene motif and may or may not be fused with other ring systems.

TABLE 1

Examples of the polycyclic organic compound comprising the rylene motif, where n is an integer greater than or equal to 0 and preferentially ranges between 0 and 8.

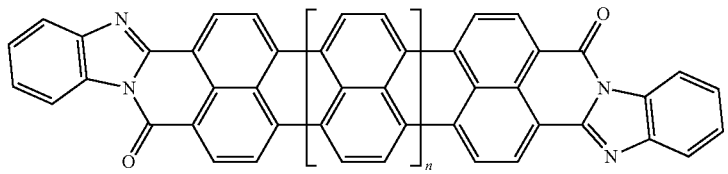 1

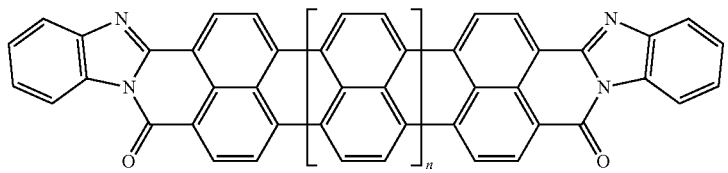 2

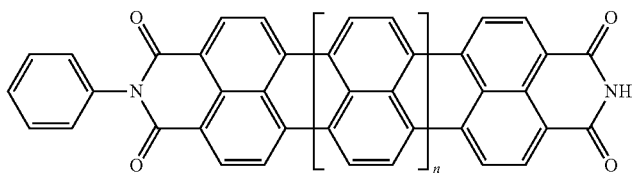 3

TABLE 1-continued
Examples of the polycyclic organic compound comprising the rylene motif, where n is an integer greater than or equal to 0 and preferentially ranges between 0 and 8.
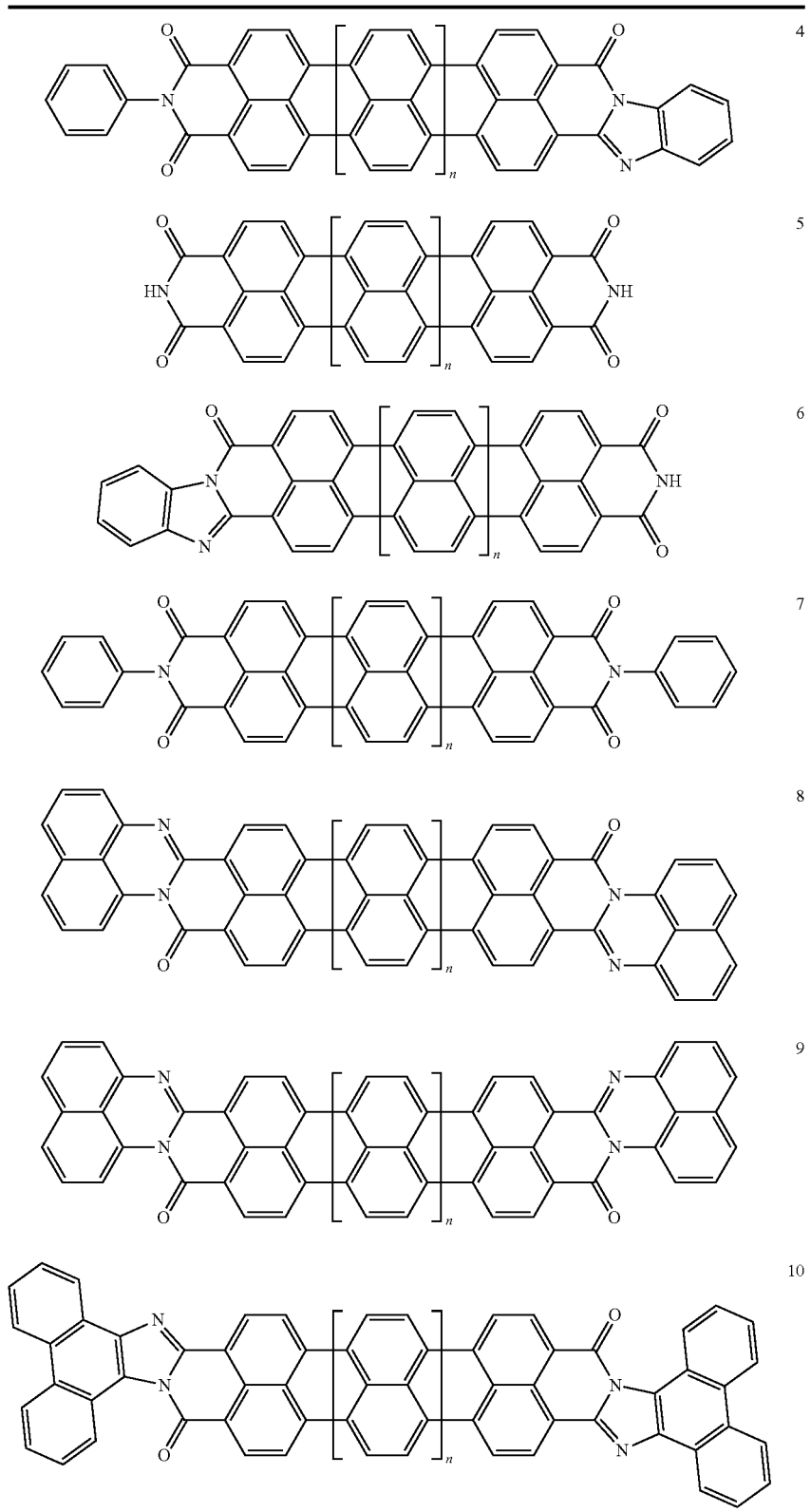

TABLE 1-continued

Examples of the polycyclic organic compound comprising the rylene motif, where n is an integer greater than or equal to 0 and preferentially ranges between 0 and 8.

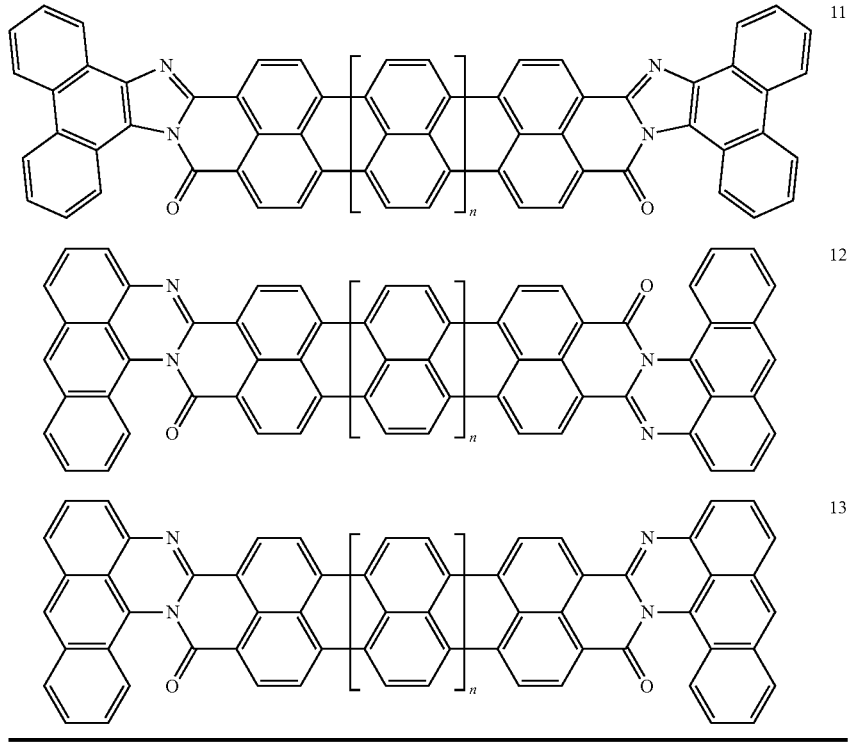

A method of producing a capacitor, which comprises the steps of a) preparation of a conducting substrate serving as one of the electrodes, b) application of a molecular material on the substrate, c) formation of the solid layer molecular material layer on the substrate, and d) formation of the second electrode on the solid molecular material layer, wherein the molecular material is described by the general formula:

$$D_p\text{-(Core)-}H_q \quad (I)$$

where Core is a conductive and polarizable anisometric core, having conjugated π-systems, and characterized by a longitudinal axis, D and H are insulating substituents, and p and q are numbers of the D and H substituents accordingly. The insulating substituents are selectively attached to any available positions on the polarizable anisometric core including at apex positions and lateral positions as related to the longitudinal axis, and p and q are independently selected from values 1, 2, 3, 4, and 5. And, Core possesses one or more dopant groups that enhance polarizability. Wherein, the one or more dopant groups are selectively attached to the anisometric core to enhance both linear and nonlinear polarizability of the compound.

The anisometric core is a flat molecular system having thickness not exceeding 0.34±0.03 nm and unequal dimensions. It can be characterized by a longitudinal axis which is an axis along the lengthwise direction of the core.

In one embodiment of the disclosed capacitor at least one of the insulating groups D and at least one of the insulating groups H are independently selected from the list comprising alkyl, fluorinated alkyl, chlorinated alkyl, branched and complex alkyl, branched and complex fluorinated alkyl, branched and complex chlorinated alkyl groups, and any combination thereof.

In one embodiment of the disclosed capacitor the anisometric cores form conductive stacks due to π-π-interaction, and the insulating substituents form the insulating sublayers surrounding said stacks. The longitudinal axes of the adjacent anisometric cores form a twist angle α, said twist angle is in the range of 0°≤α≤90°, and distance between the cores in the stacks is 0.34±0.03 nm.

Depending on the application of the device, a dielectric permittivity of the insulating sublayer material formed with the insulating substitutes $\varepsilon_{ins}$ can be in the broad range; for most embodiments it is in the range between about 2 and 25. The insulating sublayer material is characterized by a band gap of greater than 4 eV. The insulating sublayer is characterized by a breakdown field strength being in the range between about of 0.01 V/nm and 10 V/nm. Due to high polarizability of the anisometric cores, the conductive molecular stacks possess relatively high dielectric permittivity $\varepsilon_{cor}$ in comparison with dielectric permittivity of the insulating sublayer $\varepsilon_{ins}$. Thus, the conductive polarizable stacks possess dielectric permittivity $\varepsilon_{cor}$, which is ten to one hundred thousand times higher than dielectric permittivity $E_{ins}$ of the insulating sublayer. Therefore, electric field intensity in the insulating sublayer $E_{ins}$ and electric field intensity in the conductive polarizable molecular stacks $E_{cor}$ satisfy:

$$E_{cor} = (\varepsilon_{ins}/\varepsilon_{cor}) \cdot E_{ins}. \quad (1)$$

Electric field intensity $E_{cor}$ is much less than electric field intensity $E_{ins}$ and the voltage enclosed to the energy storage device is distributed over the insulating sublayers. In order to increase a working voltage of the energy storage device it is necessary to increase number of the insulating sublayers.

In one embodiment of the present invention the anisometric cores form twisted conductive stacks, wherein the longitudinal axes (indicated by dashed lines in the insert in FIG. 3) of the adjacent anisometric cores are twisted with respect to each other at a twist angle α. In yet another embodiment the dielectric layer has a hexagonal crystal structure.

Figure 3:
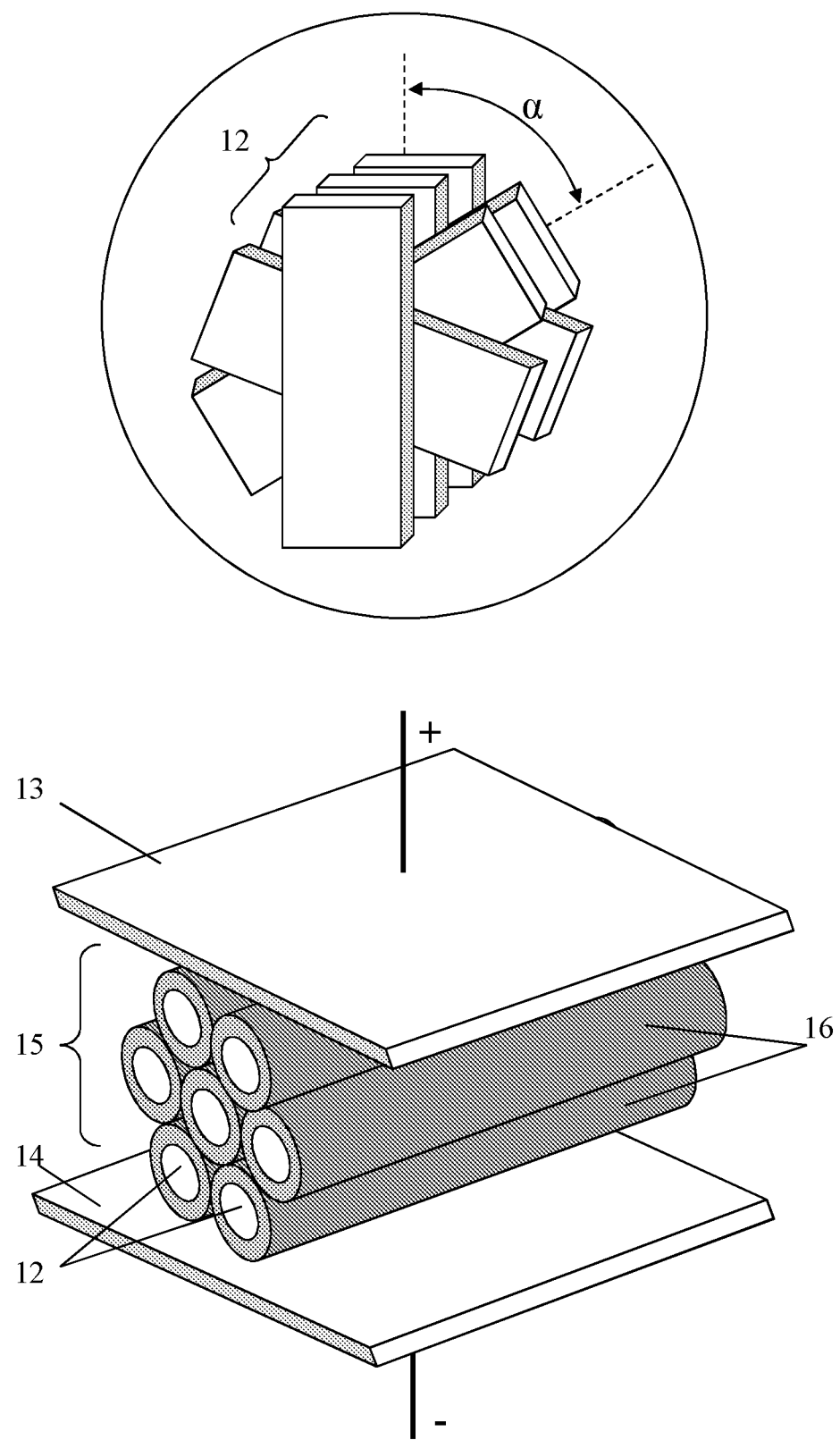
FIG. 3 is a schematic illustration that shows a disclosed capacitor with a hexagonal crystal structure in the dielectric layer of the molecular material, according to an embodiment of the invention. The insert is a schematic illustration that shows a formation of twisted conductive stacks.

In the schematic view in FIG. 3 the capacitor comprises two electrodes 13 and 14 and dielectric layer 15 which comprises the anisotropic twisted stacks 12 surrounded with insulating sublayers 16. The term "hexagonal structure" is referred to the molecular material structure of the dielectric layer comprising the twisted conductive stacks. The dielectric layer is characterized by a dense packing of the twisted stacks located parallel to each other. The projections of these stacks onto a plane normal to them form the two-dimensional structure possessing hexagonal symmetry.

Figure 4:
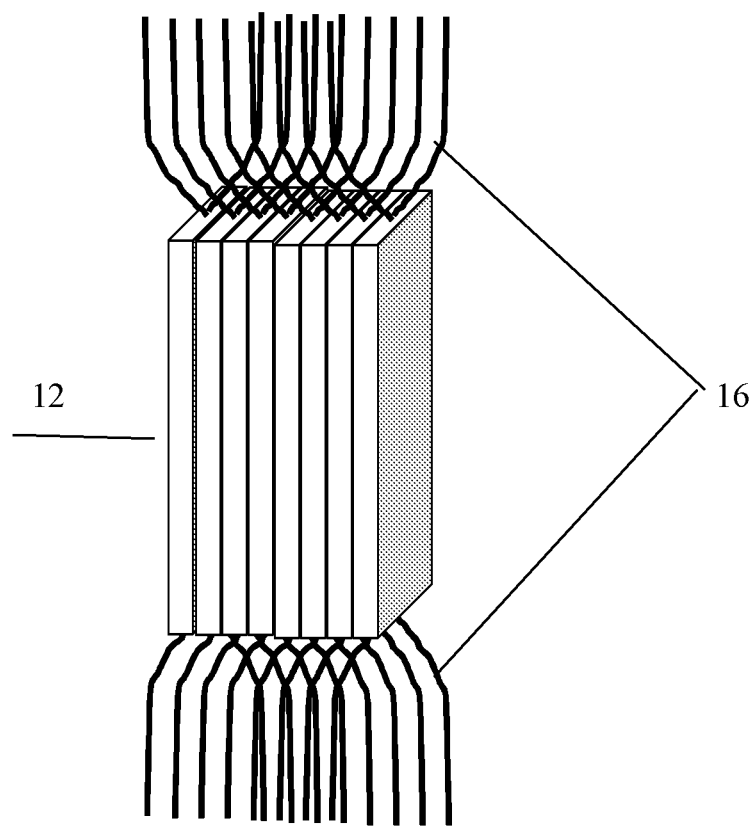
FIG. 4 is a schematic illustration that shows a dielectric layer of the molecular material, wherein the conductive stacks are formed with a twist angle equal to zero, according to an embodiment of the invention.

In one embodiment of the disclosed capacitor the anisometric cores form conductive stacks with the twist angle equal to zero. The longitudinal axes of the anisometric cores in one stack are parallel to each other and perpendicular to the surface of said electrodes. FIG. 4 schematically shows the stack 12 formed with the anisometric cores and the insulating sublayers 16 formed with the insulating substituents. The insulating substituents form the insulating sublayers between the conductive stacks and also between the conductive stacks and electrodes. The additional role of the insulating substitutes is increasing of the work function in the molecular material. Work function is the minimum amount of energy required to remove an electron from the surface of the conductive stack.

Figure 5:
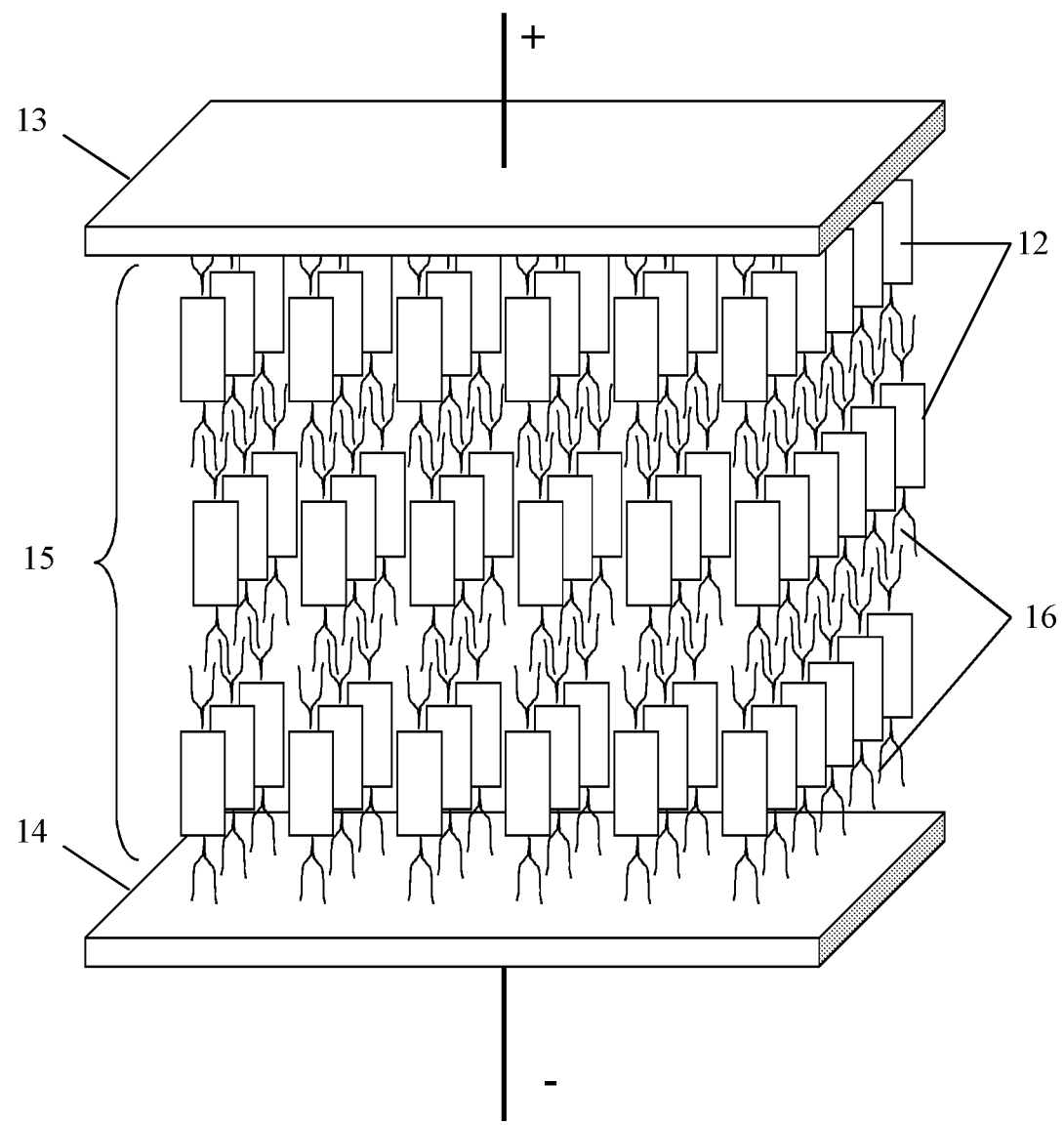
FIG. 5 is a schematic illustration that shows a disclosed capacitor with a lamellar structure of the dielectric layer of the molecular material, according to an embodiment of the invention.
Figure 6:
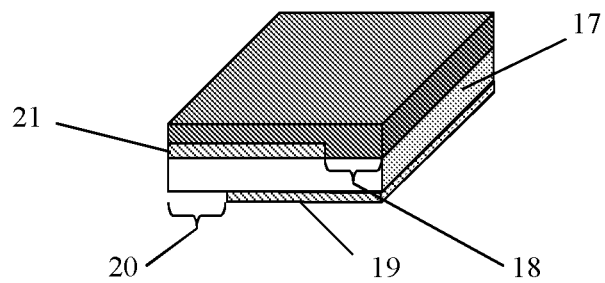
FIG. 6 shows a cross-section of a multilayered tapes structure of metalized substrate electrode, an energy storage material, and a second electrode.

In yet another embodiment the molecular material has a lamellar crystal structure. Lamellar structures or microstructures are composed of the alternating fine layers (sublayers) of different materials and/or regions of different structure and/or properties, as for example in a lamellar polyethylene. In the present invention the fine layers of the conductive stacks are alternating with the amorphous sublayers of the insulating substituents. FIG. 5 shows a capacitor with the lamellar structure of the dielectric layer, according to an embodiment of the invention. The capacitor comprises two electrodes 13 and 14, the dielectric layer 15 which comprises the fine layers of the conductive stacks 12 formed with the polarizable anisometric cores, and isotropic insulating sublayers 16.

The polarizable anisometric cores of the molecular material of the disclosed capacitor may possess translation periodicity and symmetry in at least one direction. The properties of a system with translational symmetry do not change when the material shifts on a certain vector which is called a translation vector. In some instances, crystals of the disclosed molecular material may possess a translational symmetry in all three directions.

In one embodiment of the present invention, the polarizable anisometric core is electroconductive oligomer comprising monomers having conjugated π-systems and the electroconductive oligomers form molecular stacks due to π-π-interaction and stacks are positioned parallel to surface of the planar electrode. In one embodiment of the present invention, the electroconductive oligomers are selected from the list comprising following structural formulas corresponding to one of structures 14 to 33 as given in Tables 2A, 2B, and 2C.

TABLE 2A

Examples of the electroconductive oligomers

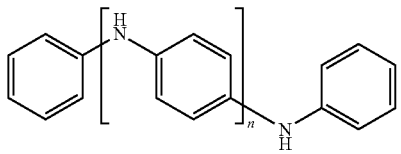

14

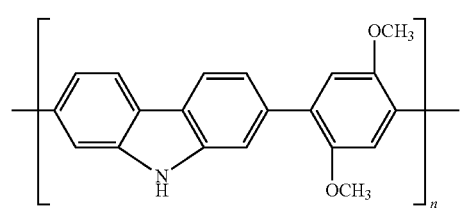

15

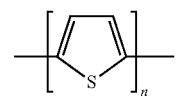

16

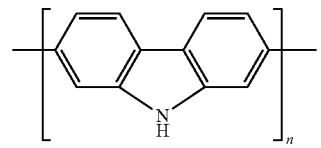

17

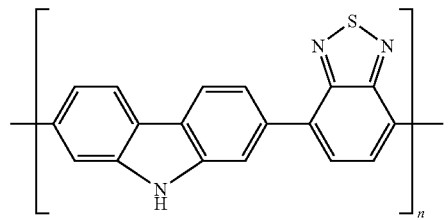

18

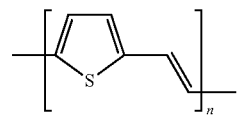

19

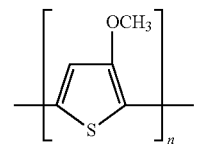

20 where n equals to 2, 3, 4, 5, 6, 7, 8, 9, 10, 11 or 12.

TABLE 2B
Examples of the electroconductive oligomers
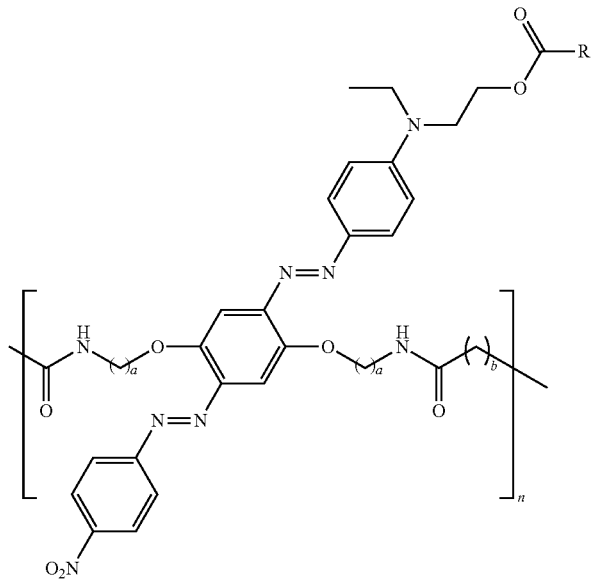
21
a = 2, 3, 4; b = 2, 3, 4
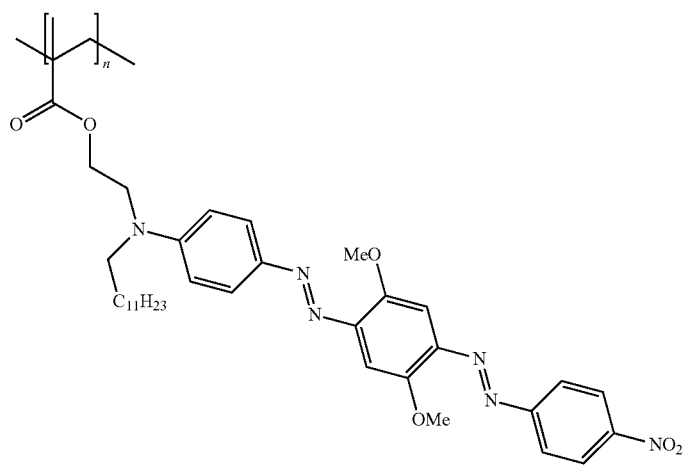
22
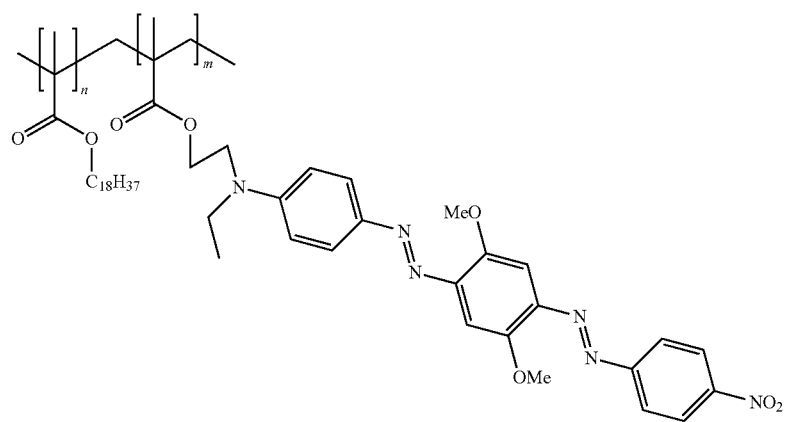
23

TABLE 2B-continued
Examples of the electroconductive oligomers
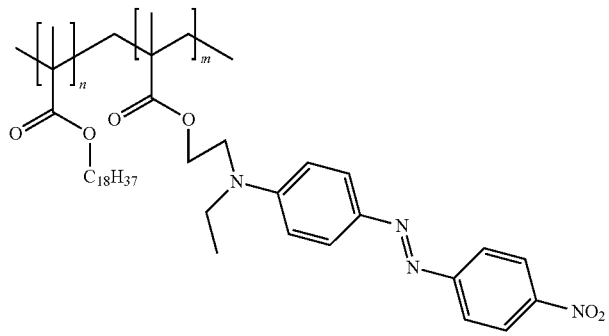
24
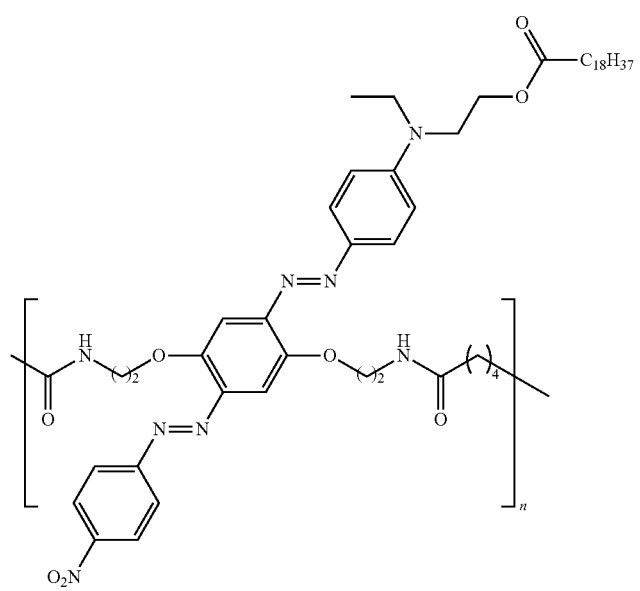
25
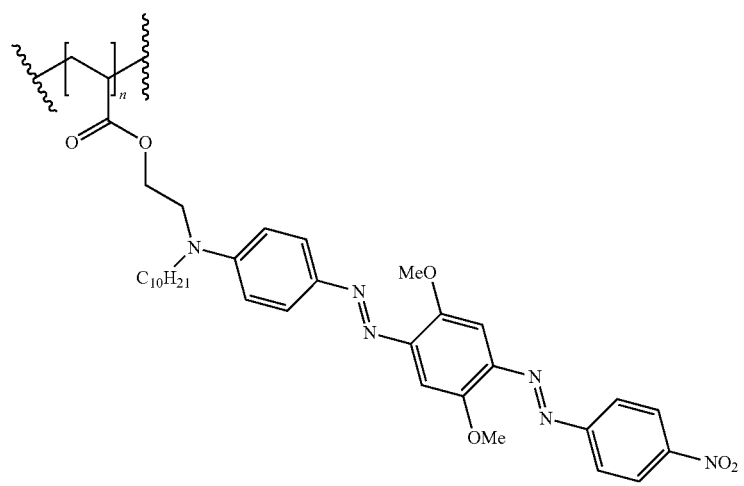
26 where n and m are independently an integer between 1 and 100, and phenyl groups conjugated by azo-bridges in the above examples can be extended to 3, 4, 5, 6, 7, 8, 9, 10, etc.

TABLE 2C

Examples of the electroconductive oligomers

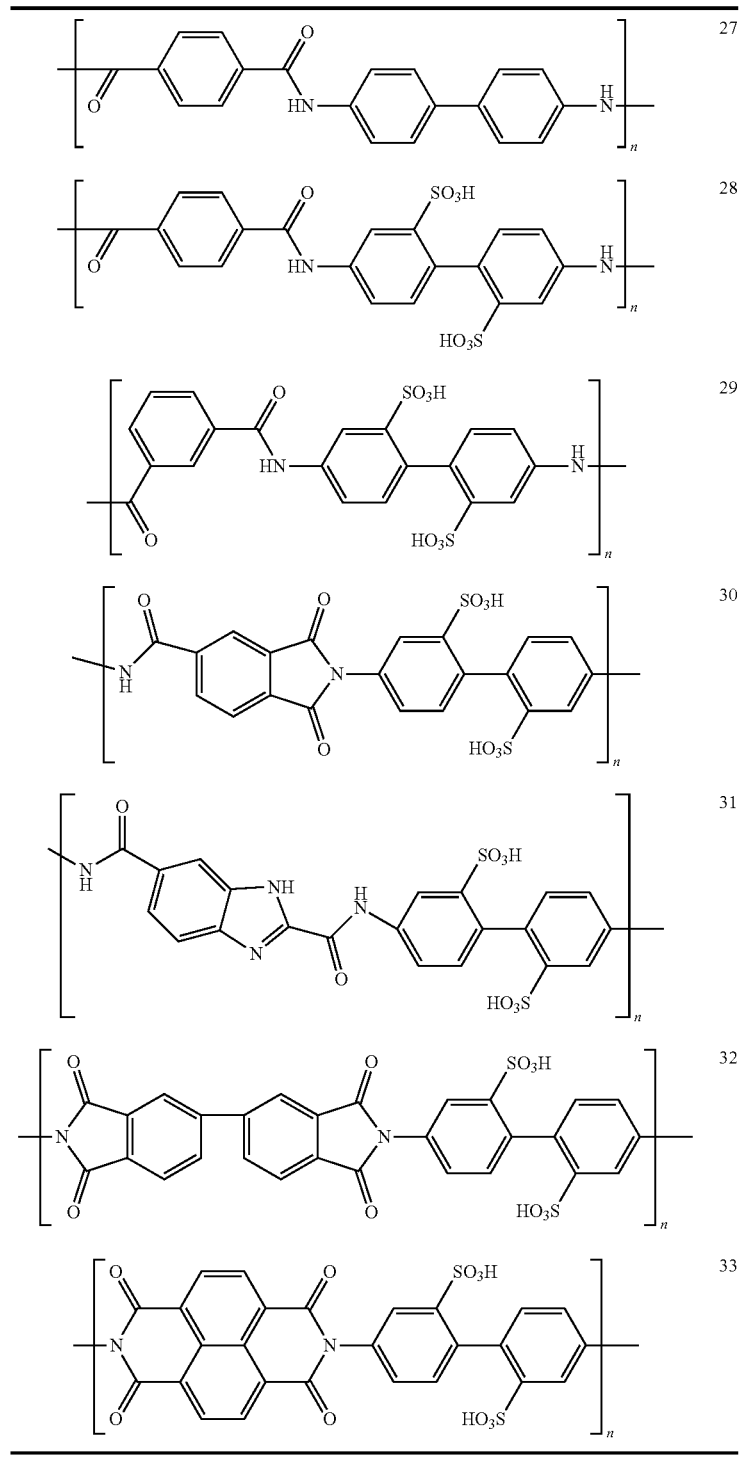

where n is an integer between 1 and 100.

In another implementation of the organic compound, the Core in the above general structural formula comprises an electro-conductive oligomer of azo-dye chromophores. The repeating backbone may contain a portion of the chromophore or possess a handle allowing the chromophore to be present as sidechains. Sidechains may be added to the final backbone product or incorporated into individual monomers that are then polymerized. If incorporated into the backbone the chromophores may be modified such that they react with the other segments of the backbone to form the final product or they may be incorporated into monomers that are then polymerized.

These chromophores impart high polarizability due to delocalization of electrons. This polarizability may be enhanced by dopant groups. The composite oligomer may further include resistive tails that will provide insulation within the material. In some embodiments, the resistive tails may be rigid in order to limit the motion of the sidechains, potentially stabilizing pi-pi stacking interactions between sidechains while simultaneously making the material more stable by eliminating voids. In some embodiments, the resistive tails may be rigid in order to limit voids within the material. Non-limiting examples of repeating backbones include, but is not limited to, (meth)acrylates, polyvinyls, peptides, peptoids, and polyimides.

Examples of suitable chromophores are, but are not limited to, Disperse Red-1, Black Hole Quencher-1, and Black Hole Quencher-2. In many of the embodiments it may not be necessary for all monomer units to bear a chromophore, and in some it may be desirable to possess other side chains or sites within the repeating backbone that impart other qualities to the material such as stability, ease of purification, flexibility of finished film, etc.

For embodiments where the chromophores are incorporated as side chains, the resistive tails may be added before the sidechains are attached to a finished oligomer, after sidechains have been chemically added to a finished oligomer, or incorporated into the oligomer during synthesis by incorporation into monomer units.

For embodiments where the chromophore is part of the backbone the tails may be attached to the finished composite oligomer or incorporated into monomer units and added during composite synthesis.

Non-limiting examples of suitable tails are alkyl, haloalkyl, cycloakyl, cyclohaloalkyl, and polyether. Such compounds and their synthesis are described in U.S. patent application Ser. No. 15/090,509 and U.S. patent application Ser. No. 15/163,595 which are herein incorporated by reference in their entirety.

Electrodes of the disclosed capacitor may be made of any suitable material, including but not limited to metals such as Pt, Cu, Al, Ag or Au; metal alloys, graphene, graphite, or ribtan. The electrodes may be substantially planar (substantially not rough) and in parallel. Further still, the electrodes optionally consist of multiple molecular layers on substrates of said metal or graphite. The molecular layers being described in U.S. patent application Ser. No. 15/368,171 filed Dec. 2, 2016 and fully incorporated by reference herein.

Alternatively, the first electrode may be of a metalized tape consisting of a substrate film and one metalized face-side. Wherein the metalized face-side consisting of any metal or combination thereof. The substrate film may consist of polycarbonate, polyethylene terephthalate (PET, also known as polyester), polypropylene, polystyrene, and polysulfone. In an alternative embodiment, said substrate film may consist of the energy storage material described hereinabove.

Figure 7:
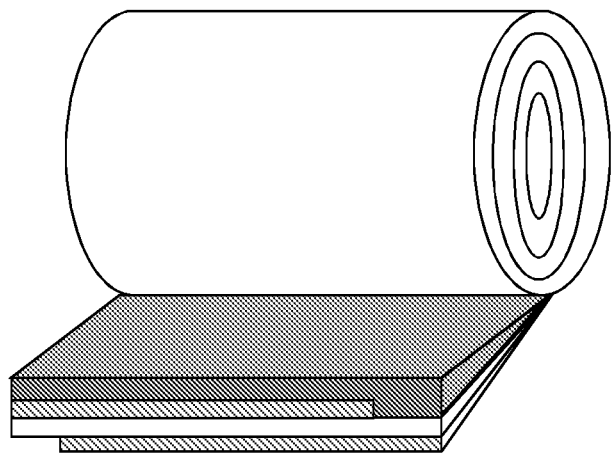
FIG. 7 shows an example of winding of a multilayered tape capacitor.
Figure 8:
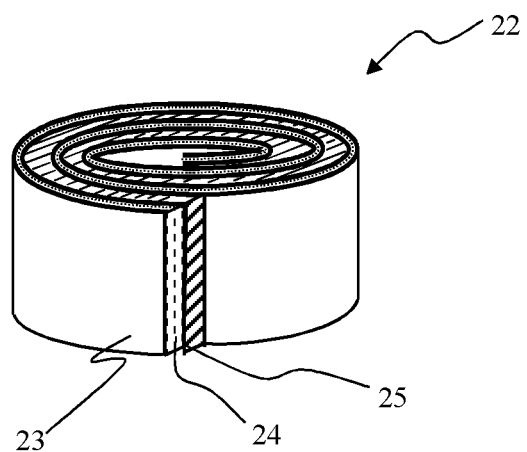
FIG. 8 shows an alternative embodiment of a wound capacitor.

In some embodiments, the capacitor can be coiled as in FIG. 7. Further schema and methods of production are taught in U.S. patent application Ser. No. 14/752,600 filed on Jun. 26, 2015 which is fully incorporated by reference herein.

In some embodiments, the capacitor can be produced by a variety of manufacturing methods, which in general comprise the steps of a) preparation of a conducting substrate serving as one of the electrodes, b) application of a molecular material on the substrate, c) formation of the solid layer molecular material layer on the substrate, and d) formation of the second electrode on the solid molecular material layer, wherein the molecular material is described by the general formula:

$$D_p\text{-(Core)-}H_q \qquad (I)$$

where Core 10 is a polarizable conductive anisometric core, having conjugated π-systems and characterized by a longitudinal axis, D and H are insulating substituents, and p and q are numbers of substituents D and H accordingly. The insulating substituents are selectively attached to the polarizable anisometric core including at apex positions and lateral positions as related to the longitudinal axis, and p and q are independently selected from values 1, 2, 3, 4, and 5. And, Core possesses one or more dopant groups that enhance polarizability. Wherein, the one or more dopant groups are selectively attached to the anisometric core to enhance both linear and nonlinear polarizability of the compound.

In one embodiment of the disclosed method at least one of the insulating groups D and at least one of the insulating groups H are independently selected from the list comprising alkyl, fluorinated alkyl, chlorinated alkyl, branched and complex alkyl, branched and complex fluorinated alkyl, branched and complex chlorinated alkyl groups, and any combination thereof.

In one embodiment of the disclosed method the application step b) comprises application of a solution of the molecular material, and the solid layer formation step c) comprises drying to form a solid molecular material layer.

In yet another embodiment of the disclosed method the application step b) comprises application of a melt of the molecular material, and the solid layer formation step c) comprises cooling down to form a solid molecular material layer.

In order that the embodiments of the invention may be more readily understood, reference is made to the following example, which is intended to be illustrative of the invention, but is not intended to be limiting in scope.

In an aspect, the present disclosure provides a crystal dielectric layer comprising the disclosed organic compound. The crystal dielectric layers are produced from the disclosed organic compound by Cascade Crystallization. The arrangement of electrophilic groups (acceptors) and nucleophilic groups (donors) on the aromatic polycyclic conjugated core promote formation of supramolecules.

The Cascade Crystallization process involves a chemical modification step and four steps of ordering during the crystal dielectric layer formation. The chemical modification step introduces hydrophilic groups on the periphery of the molecule of the disclosed organic compound in order to impart amphiphilic properties to the molecule. Amphiphilic molecules stack together into supramolecules, which is the first step of ordering. The supramolecules are then converted into a liquid-crystalline state to form a liquid crystal such a lyotropic liquid crystal or thermotropic liquid crystal, which is the second step of ordering. The liquid crystal ordering can be manipulated via solvent concentration (which may be determined by the supramolecules' critical micelle concentration), temperature as related to the transition phases of the liquid crystal, an applied external electric or magnetic field to orient dipoles of liquid crystal molecules, or any combination thereof. The lyotropic liquid crystal or thermotropic liquid crystal is then, for example, deposited under the action of a shear force (or meniscus force) onto a substrate using the Mayer Rod shearing technique, so that shear force (or the meniscus) direction determines the crystal axis direction in the resulting solid crystal layer. The external alignment upon the liquid crystal, can be produced using any other means, for example by applying an external electric field at normal or elevated temperature, with or without additional illumination, electric field, magnetic field, or optical field (e.g., coherent photovoltaic effect); the degree of the external alignment should be sufficient to impart necessary orientation to the supramolecules of the lyotropic liquid crystal and form a structure, which serves as a base of the crystal lattice of the crystal dielectric layer. This directional deposition is third step of ordering, representing the global ordering of the crystalline or polycrystalline structure on the substrate surface. The last step of the Cascade Crystallization process is drying/crystallization, which converts the liquid crystal into a solid crystal dielectric layer. The term Cascade Crystallization process is used to refer to the chemical modification and four ordering steps as a combination process.

The Cascade Crystallization process is used for production of thin crystalline dielectric layers. The dielectric layer produced by the Cascade Crystallization process has a global order which means that a direction of the crystallographic axis of the layer over the entire substrate surface is controlled by the deposition process. Molecules of the deposited material are packed into supramolecules with a limited freedom of diffusion or motion. The thin crystalline dielectric layer is characterized by an interplanar spacing of 0.34±0.03 nm-in the direction of one of the optical axes.

EXAMPLE 1

Example 1 describes a capacitor comprising a dielectric layer formed with the solid molecular material of lamellar structure as shown in FIG. 5.

The capacitor comprises two electrodes 13 and 14, the dielectric layer 15 which comprises the conductive anisometric stacks 12 formed with the polarizable anisometric cores, and isotropic insulating sublayers 16. Polyaniline (PANI) is used as the polarizable anisometric core, and fluorinated alkyl substituents are used as the insulating substituents. The conductive anisometric stacks formed with polyaniline (PANI) have the dielectric permittivity $\varepsilon_{cor}$ equal to 10,000. Thickness of each insulating sublayers formed by the substituents is approximately $d_{ins}$=2 nm, and number of the insulating sublayers $n_{ins}$ is equal to 500. Electrodes 13 and 14 are made of copper. Dielectric permittivity of the insulating sublayers is equal to 2.2 (i.e. $\varepsilon_{ins}$=2.2) and its breakdown voltage is equal to 1 V/nm. The working voltage of the capacitor does not exceed the breakdown voltage Vbd which is approximately equal to 1000 V.

In some embodiments, the capacitor may be incorporated into energy storage elements called energy storage devices, energy storage cells, energy storage modules, and energy storage systems. These energy storage elements are further described in U.S. patent application Ser. No. 15/043,315 filed on Feb. 12, 2016.

Figure 9:
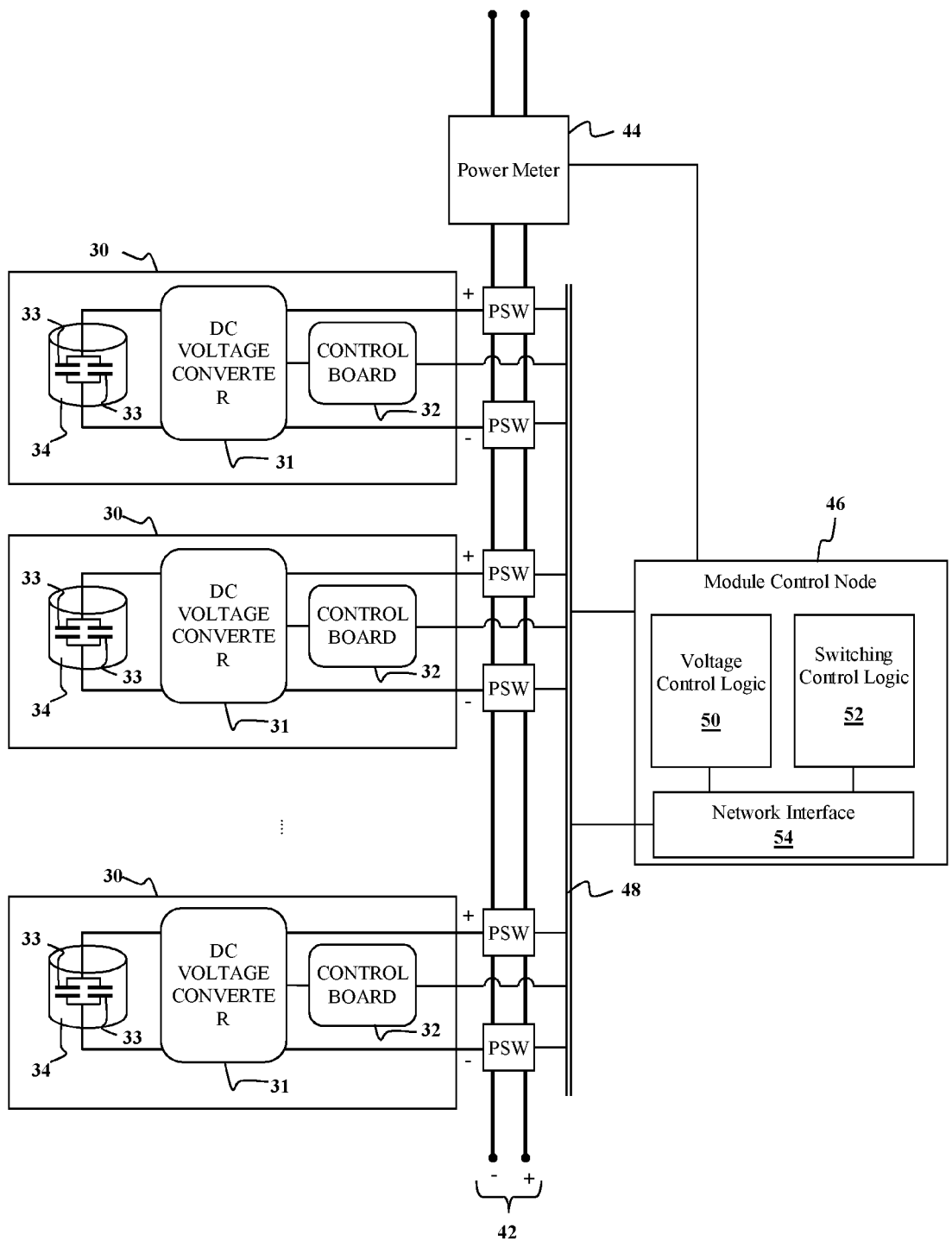
FIG. 9 shows an example of a capacitive energy storage module having two or more networked energy storage cells according to an alternative aspect of the present disclosure.

As an aspect of the present disclosure, a capacitive energy storage module 40, e.g., as illustrated in FIG. 9. In the illustrated example, the energy storage module 40 includes two or more energy storage cells 30 of the type described above. Each energy storage cell includes a capacitive energy storage device 34 having one or more capacitors 33 and a DC-voltage converter 31, which may be a buck converter, boost converter, or buck/boost converter. In addition, each module may include a control board 32 of the type described below with respect to FIG. 11 and an (optional) cooling mechanism (not shown). The module 40 may further include an interconnection system that connects the anodes and cathodes of the individual energy storage cells to create a common anode and common cathode of the capacitive energy storage module.

In yet another aspect, some implementations, the interconnection system includes a parameter bus 42 and power switches PSW. Each energy storage cell 30 in the module 40 may be coupled to the parameter bus 42 via the power switches PSW. These switches allow two or more modules to be selectively coupled in parallel or in series via two or more rails that can serve as the common anode and common cathode. The power switches can also allow one or more energy storage cells to be disconnected from the module, e.g., to allow for redundancy and/or maintenance of cells without interrupting operation of the module. The power switches PSW may be based on solid state power switching technology or may be implemented by electromechanical switches (e.g., relays) or some combination of the two.

In some implementations, the energy storage module further comprises a power meter 44 to monitor power input or output to the module. In some implementations, the energy storage module further comprises a networked control node 46 configured to control power output from and power input to the module. The networked control node 46 allows each module to talk with a system control computer over a high speed network. The networked control node 46 includes voltage control logic circuitry 50 configured to selectively control the operation of each of voltage controller 31 in each of the energy storage cells 34, e.g., via their respective control boards 32. The control node 46 may also include switch control logic circuitry 52 configured to control operation of the power switches PSW. The control boards 32 and power switches PSW may be connected to the control node 46 via a data bus 48. The voltage control and switching logic circuitry in the networked control node 46 may be implemented by one or more microprocessors, microcontrollers, application specific integrated circuits (ASICs), field programmable gate arrays (FPGAs), or complex programmable logic devices (CPLDs). The control node 46 may include a network interface 54 to facilitate transfer of signals between the voltage control logic circuitry 50 and the control boards 32 on the individual energy storage cells 34 and also to transfer signals between the switching logic circuitry 52 and the power switches PSW, e.g., via the data bus 48.

Figure 10:
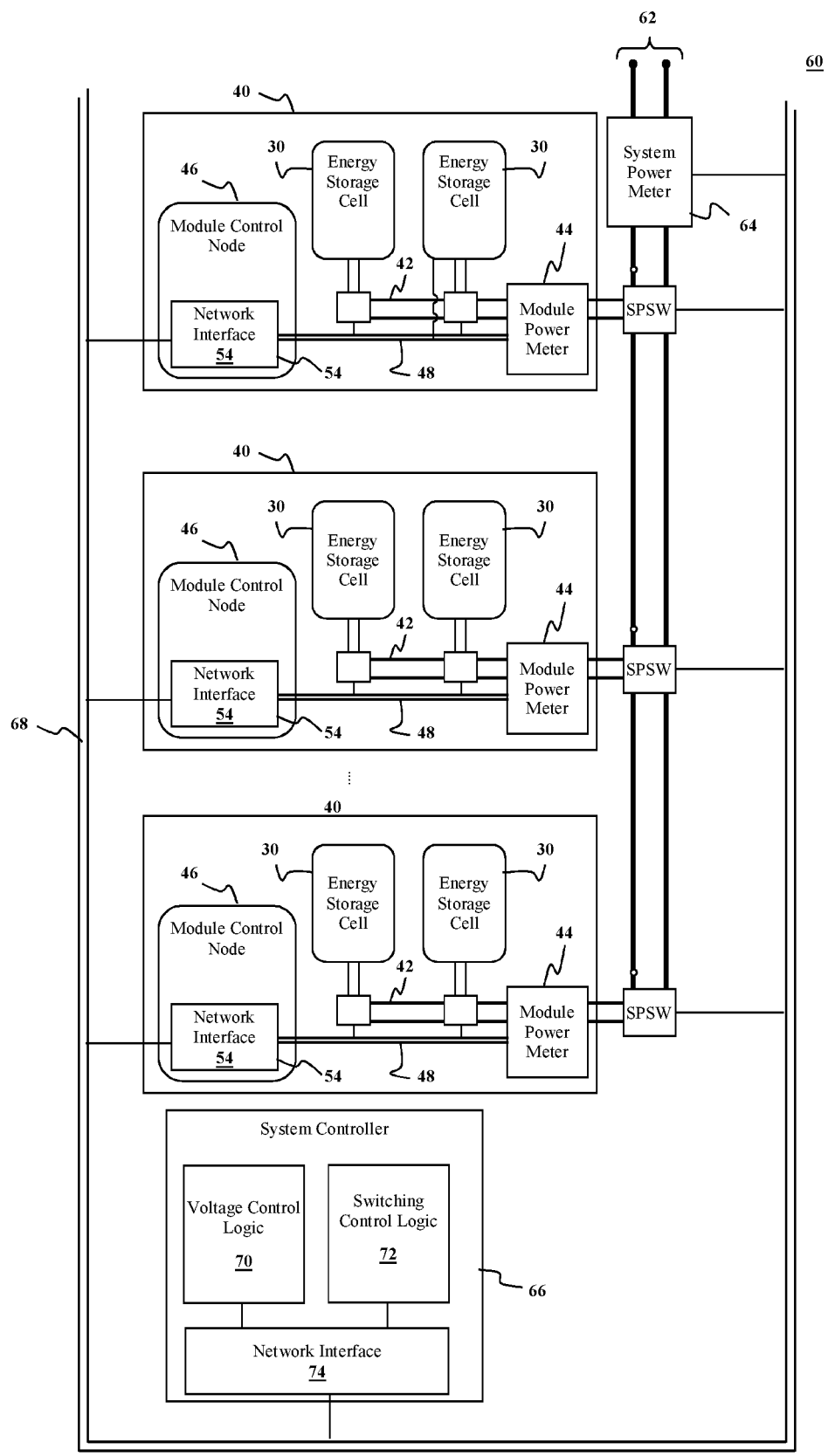
FIG. 10 shows an example of a capacitive energy storage system having two or more energy storage networked modules according to an alternative aspect of the present disclosure.

According to yet another aspect of the present disclosure a capacitive energy storage system may include two or more networked capacitive energy storage modules, e.g., of the type shown in FIG. 9. One embodiment of such a capacitive energy storage system 60 is shown in FIG. 10. The system 60 includes two or more energy storage modules 40 of the type shown in FIG. 9. Each capacitive energy storage module 40 includes two or more capacitive energy storage cells 30, e.g., of the type shown in FIG. 11 connected by an interconnection system 42 and controlled by a control node 46. Each capacitive energy storage module may also include a module power meter 44. Although it is not shown in FIG. 9, each control node 46 may include voltage control logic circuitry 50 to control voltage controllers within the individual capacitive energy storage cells 30 and switching logic circuitry 52 to control internal power switches with the module, as described above. In addition, each control node 46 includes an internal data bus 48 and a network interface 54, which may be connected as described above. Power to and from capacitive energy storage modules 40 is coupled to a system power bus 62 via system power switches SPSW, which may be based on solid state power switching technology or may be implemented by electromechanical switches (e.g., relays) or some combination of the two. In some implementations, there may be an inverter (not shown) coupled between each capacitive energy storage module 40 and the system power bus 62 to convert DC power from the module to AC power or vice versa.

The system 60 includes a system controller 66 connected to a system data bus 68. The system controller may include switching control logic 72, voltage control logic 70, and system network interface 74. The voltage control logic 70 may be configured to control the operation of individual DC-voltage controllers within individual cells 30 of individual modules 40. The switching control logic 72 may be configured to control operation of the system power switches SPSW and also the power switches PSW within individual capacitive energy storage modules 40. Voltage control signals may be sent from the voltage control logic 72 to a specific DC-voltage control device 31 within a specific capacitive energy storage cell 30 of a specific capacitive energy storage module through the network interface 74, the system data bus 68, the module network interface 54 of the control node 46 for the specific module, the module data bus 48, and the control board 4 of the individual cell 1.

By way of example, and not by way of limitation, the system controller 66 may be a deterministic controller, an asynchronous controller, or a controller having distributed clock. In one particular embodiment of the capacitive energy storage system 60, the system controller 66 may include a distributed clock configured to synchronize several independent voltage conversion devices in one or more capacitive energy storage cells of one or more of the capacitive energy storage modules 40.

Aspects of the present disclosure allow for electrical energy storage on a much larger scale than possible with conventional electrical energy storage systems. A wide range of energy storage needs can be met by selectively combining one or more capacitors with a DC-voltage conversion devices into a cell, combining two or more cells into a module, or combining two or more modules into systems.

Figure 11:
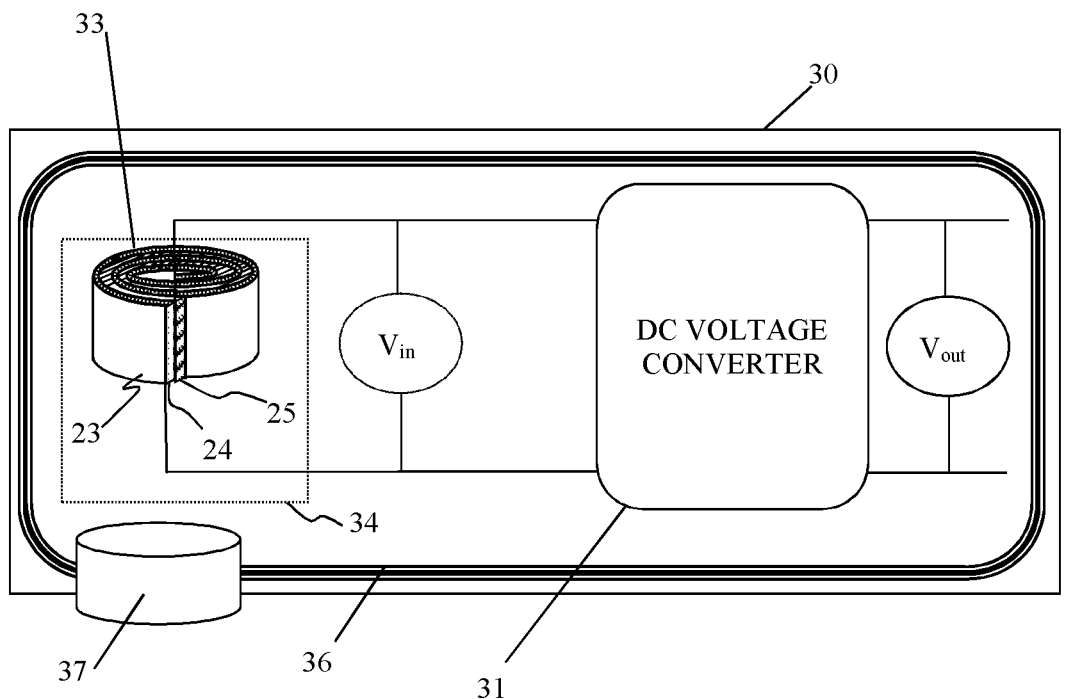
FIG. 11 schematically shows an energy storage cell.

As depicted in FIG. 11, in one embodiment of the energy storage cell 30, each of the one or more capacitors 33 comprises a first electrode 23, a second electrode 25, and a dielectric material layer of the type described in the current disclosure 24 disposed between said first and second electrodes. The electrodes 23, 25 may be made of a metal, such as copper, zinc, or aluminum or other conductive material and are generally planar in shape. In one implementation, the electrodes and dielectric material layer 24 are in the form of long strips of material that are sandwiched together and wound into a coil along with an insulating material, e.g., a plastic film such as polypropylene or polyester to prevent electrical shorting between the electrodes 23, 25. Although a single capacitor 33 is shown for convenience in FIG. 11, aspects of the present disclosure are not limited to such implementations. Those skilled in the art will recognize that the capacitive energy storage device 34 may include multiple capacitors 33 connected in parallel to provide a desired amount of energy storage capacity that scales roughly with the number of capacitors in parallel. Alternatively, the capacitive energy storage device 34 may include two or more capacitors connected in series to accommodate a desired voltage level. In addition, the capacitive energy storage device 34 may include combinations of three or more capacitors in a capacitor network involving various series and parallel combination.

In yet another implementation, the capacitive energy storage devices may comprise more than one of the capacitors connected in series or parallel. In still another implementation, the capacitive energy storage device may further comprise a cooling mechanism 36. In some implementations, the cooling can be passive, e.g., using radiative cooling fins on the capacitive energy storage device 34 and DC-voltage conversion device 31. Alternatively, a fluid such as air, water or ethylene glycol can be used as a coolant in an active cooling system. By way of example, and not by way of limitation, the cooling system 36 may include conduits in thermal contact with the capacitive energy storage device 34 and DC-voltage conversion device 31. The conduits are filled with a heat exchange medium, which may be a solid, liquid or gas. In some implementations, the cooling mechanism may include a heat exchanger configured to extract heat from the heat exchange medium. In other implementations, the cooling mechanism 36 may include conduits in the form of cooling fins on the capacitive energy storage device 34 and DC-voltage conversion device 31 and the heat exchange medium is air that is blown over the cooling fins, e.g., by a fan. In another embodiment of the present invention, the heat exchanger 37 may include a phase-change heat pipe configured to carry out cooling. The cooling carried out by the phase-change heat pipe may involve a solid to liquid phase change (e.g., using melting of ice or other solid) or liquid to gas phase change (e.g., by evaporation of water or alcohol) of a phase change material. In yet another implementation, the conduits or heat exchanger 37 may include a reservoir containing a solid to liquid phase change material, such as paraffin wax.

Referring again to FIG. 11 the DC-voltage conversion device 31 may include a buck converter for applications in which $V_{out} < V_{in}$, a boost converter for applications in which $V_{out} > V_{in}$, or a bidirectional buck/boost converter for applications in which $V_{out} < V_{in}$ in certain situations and $V_{out} > V_{in}$ in other situations.

Figure 12:
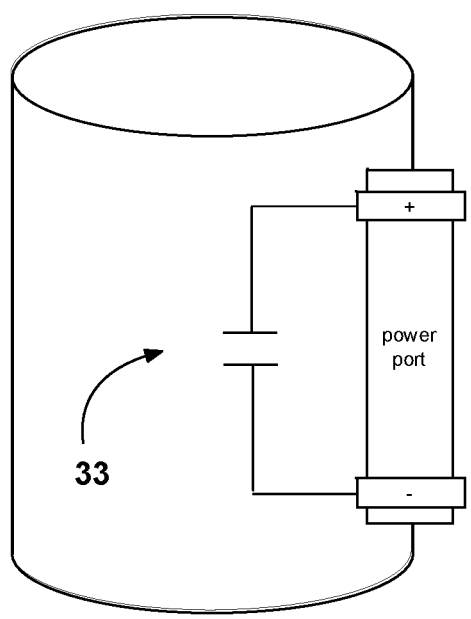
FIG. 12 shows a capacitive energy storage device containing a single capacitive element connected to a two terminal port.

FIG. 12 depicts a capacitive energy storage device with a single capacitor 33. Without limitation such devices may have multiple capacitors coupled in series to accommodate a higher voltage level or in parallel to increase the overall capacitance of the system.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A composition comprising:
electrode, and
a dielectric layer of molecular material disposed on said electrode,
wherein the molecular material is described by the general formula $$D_p\text{-(Core)-}H_q \qquad \text{(I)}$$

where Core is a polarizable conductive anisometric core, having conjugated π-systems, and characterized by a longitudinal axis,
D and H are insulating substituents, and
p and q are numbers of the D and H substituents accordingly,
wherein said substituents are selectively attached to any available positions on the polarizable anisometric core including apex positions and lateral positions as related to the longitudinal axis, and Core possesses one or more selectively attached dopant groups that enhance polarizability.

2. The composition according to claim 1, wherein the molecular material is a polymeric material soluble in organic solvents.

3. The composition according to claim 2, wherein the polarizable conductive anisometric core is selected from the list comprising structures from 1 to 6 and the insulating substances D and H ensure the solubility of molecular material in organic solvents:

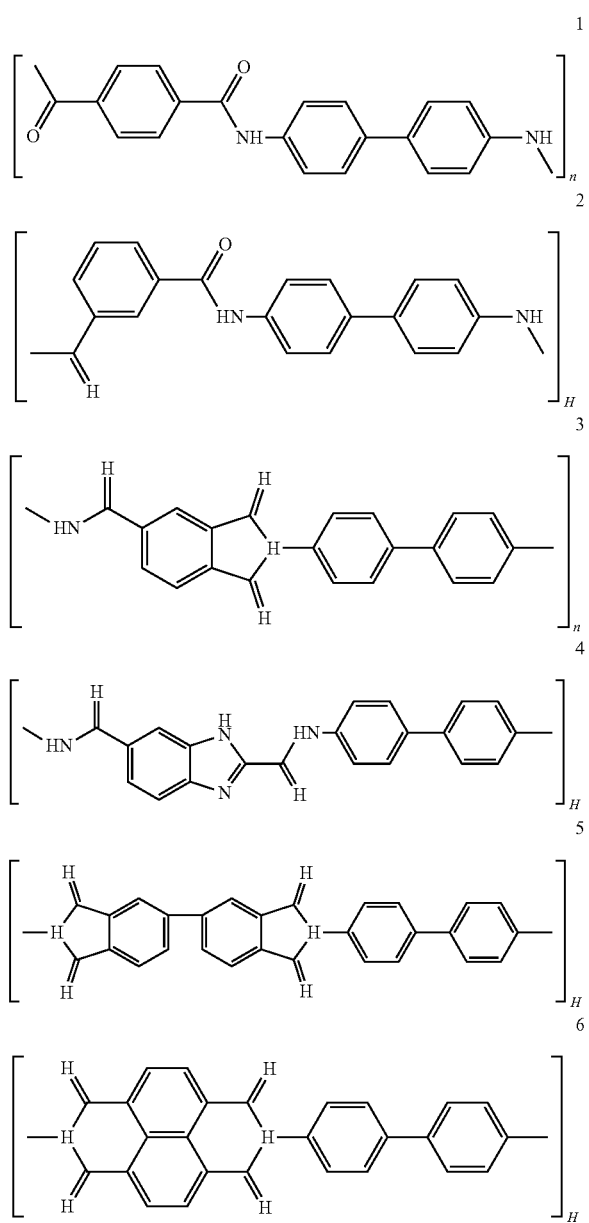

where n=1, 2, 3, 4, 5, 6, 7, and 8.

4. The composition according to claim 1, wherein the insulating substituents D and H are selected independently from the group consisting of alkyl, fluorinated alkyl, chlorinated alkyl, branched and complex alkyl, branched and complex fluorinated alkyl, branched and complex chlorinated alkyl groups, aryl, fluorinated aryl, chlorinated aryl, branched and complex aryl, branched and complex fluorinated aryl, branched and complex chlorinated aryl groups and any combination thereof.

5. The composition according to claim 1, wherein the one or more dopant groups are selected from electrophilic (acceptor) groups and nucleophilic (donor) groups where the electrophilic groups are selected from —$NO_2$, —$NH_3^+$ and —$NR_3^+$(quaternary nitrogen salts), counterion $Cl^-$, counterion $Br^-$, —CHO (aldehyde), —CRO (keto group), —$SO_3H$ (sulfonic acids), —$SO_3R$ (sulfonates), $SO_2NH_2$ (sulfonamides), —COOH (carboxylic acid), —COOR (esters, from carboxylic acid side), —COCl (carboxylic acid chlorides), —$CONH_2$ (amides, from carboxylic acid side), —$CF_3$, —$CCl_3$, —CN, wherein R is radical selected from the list comprising alkyl (methyl, ethyl, isopropyl, tert-butyl, neopentyl, cyclohexyl etc.), allyl (—$CH_2$—CH=$CH_2$), benzyl (—$CH_2C_6H_5$) groups, phenyl (+substituted phenyl) and other aryl (aromatic) groups and the nucleophilic groups (donors) are selected from —$O^-$(phenoxides, like —ONa or —OK), —$NH_2$, —NHR, —$NR_2$, —OH, —OR (ethers), —NHCOR (amides, from amine side), —OCOR (esters, from alcohol side), alkyls, —$C_6H_5$, vinyls, wherein R is radical selected from the list comprising alkyl (methyl, ethyl, isopropyl, tert-butyl, neopentyl, cyclohexyl etc.), allyl (—CH2—CH=CH2), benzyl (—CH2C6H5) groups, phenyl (+substituted phenyl) and other aryl (aromatic) groups.

6. The composition according to claim 2, wherein one or more of said insulating substituents is connected to the polymeric material via one or more of said one or more dopant groups.

7. The composition according to claim 1, wherein the first and second electrodes are made of a material independently selected from the list comprising Pt, Cu, Al, Ag, Au, Ni, Al:Ni and the metal foam and where the metal of the metal foam is selected from the list comprising Aluminum (Al), Nickel (Ni), Iron (Fe), and Copper (Cu), and a melting temperature of the metal foam is in the range 400 C-700 C, wherein metal content in the metal foam for electrode is in the range of 5% up to 30% by weight, and wherein the thickness of the first and second electrodes independently varies from 10nm to 1000 nm.

8. The composition according to claim 2, wherein the organic solvent is selected from benzene, toluene, xylenes, acetone, acetic acid, methylethylketone, hydrocarbons, chloroform, carbontetrachloride, methylenechloride, dichlorethane, chlorobenzene, alcohols, nitromethan, acetonitrile, dimethylforamide, 1,4-dioxane, tetrahydrofuran (THF), methylcyclohexane (MCH), and any combination thereof.

9. The composition according to claim 1, wherein the dielectric layer is a crystal dielectric layer, which comprises supramolecules formed with the aromatic polycyclic conjugated cores, and isotropic insulating sublayers formed with the D and H insulating substituents.

10. The composition according to claim 3, wherein the molecular material is selected from the list comprising structures from 7 to 12, where p=q=n:

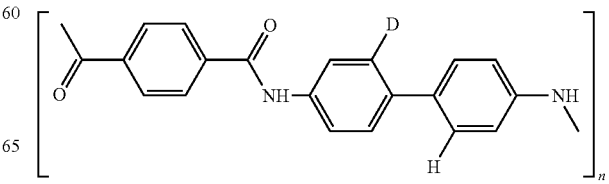

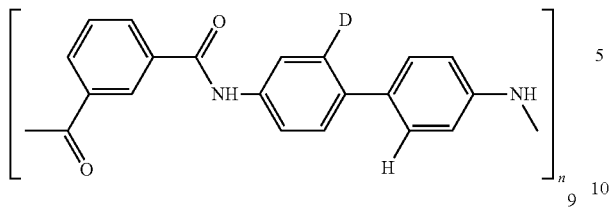

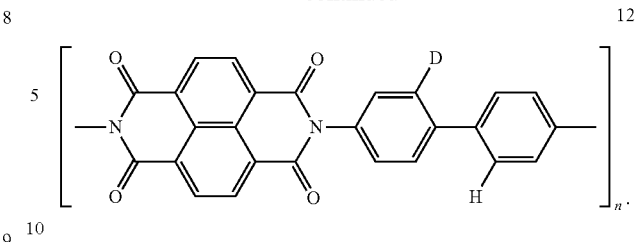

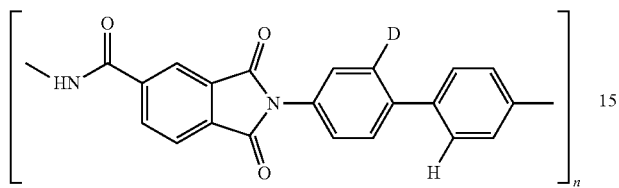

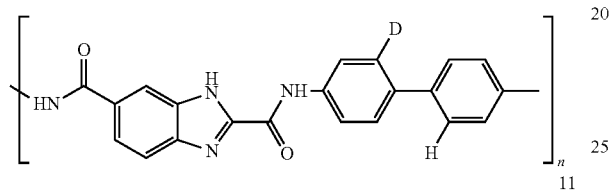

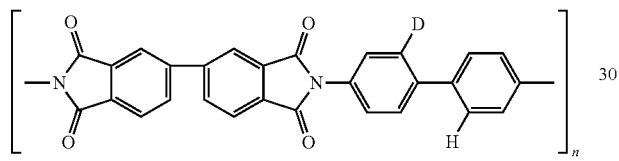

11. An energy storage cell comprising:

one or more capacitive energy storage devices; and a DC-voltage conversion device;

wherein each of the one or more capacitive energy storage devices includes one or more capacitors including the composition of claim 1, wherein the output voltage of the capacitive energy storage device is an input voltage of the DC-voltage conversion device during discharging the capacitive energy storage device, wherein the input voltage of the capacitive energy storage device is an output voltage of the DC-voltage conversion device while charging the capacitive energy storage device.

12. The energy storage cell according to claim 11, wherein the capacitive energy storage devices comprise more than one of the capacitors connected in series or parallel.

13. The energy storage cell according to claim 11, wherein the DC-voltage conversion device comprises a control board based on a bidirectional buck/boost converter and comprising microprocessor, communication interface analog to digital converters.

* * * * *